(12) United States Patent
Takamine

(10) Patent No.: US 6,583,691 B2
(45) Date of Patent: Jun. 24, 2003

(54) LONGITUDINALLY COUPLED RESONATOR TYPE SURFACE ACOUSTIC WAVE FILTER WITH AN IDT HAVING A NARROW PITCH PORTION

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 68 days.

(21) Appl. No.: 09/878,935

(22) Filed: Jun. 12, 2001

(65) Prior Publication Data

US 2002/0047759 A1 Apr. 25, 2002

(30) Foreign Application Priority Data

Jun. 26, 2000 (JP) ........................................ 2000-191562

(51) Int. Cl.[7] ................................................. H03H 9/64
(52) U.S. Cl. ...................... 333/195; 333/133; 333/196; 310/313 D
(58) Field of Search ................... 333/193–196, 333/133; 310/313 B, 313 D

(56) References Cited

U.S. PATENT DOCUMENTS 5,835,990 A * 11/1998 Saw et al. .............. 310/313 D
5,986,524 A * 11/1999 Shimoe .................... 333/195
6,335,667 B1 * 1/2002 Takagi et al. ............. 333/195
6,380,827 B1 * 4/2002 Noguchi .................... 333/193
6,420,946 B1 * 7/2002 Bauer et al. .............. 333/193

FOREIGN PATENT DOCUMENTS

JP          5-267990       10/1993
WO          WO 00/25423  *  5/2000

* cited by examiner

Primary Examiner—Barbara Summons
(74) Attorney, Agent, or Firm—Keating & Bennett, LLP

(57) ABSTRACT

In a longitudinally coupled resonator type surface acoustic wave filter including narrow pitch electrode finger portions provided in the end portions of the neighboring IDT's, respectively each which contains a portion of the electrode fingers of the IDT having a narrower pitch than the remaining portions of the electrode fingers of the IDT, the inter-center distance between the centers of at least one pair of adjacent electrode fingers is deviated from $0.25\lambda A + 0.25\lambda B$, in which $\lambda A$ represents the wavelength determined by the pitch of one of the electrode fingers, and $\lambda B$ represents the wavelength determined by the pitch of the other electrode.

32 Claims, 25 Drawing Sheets

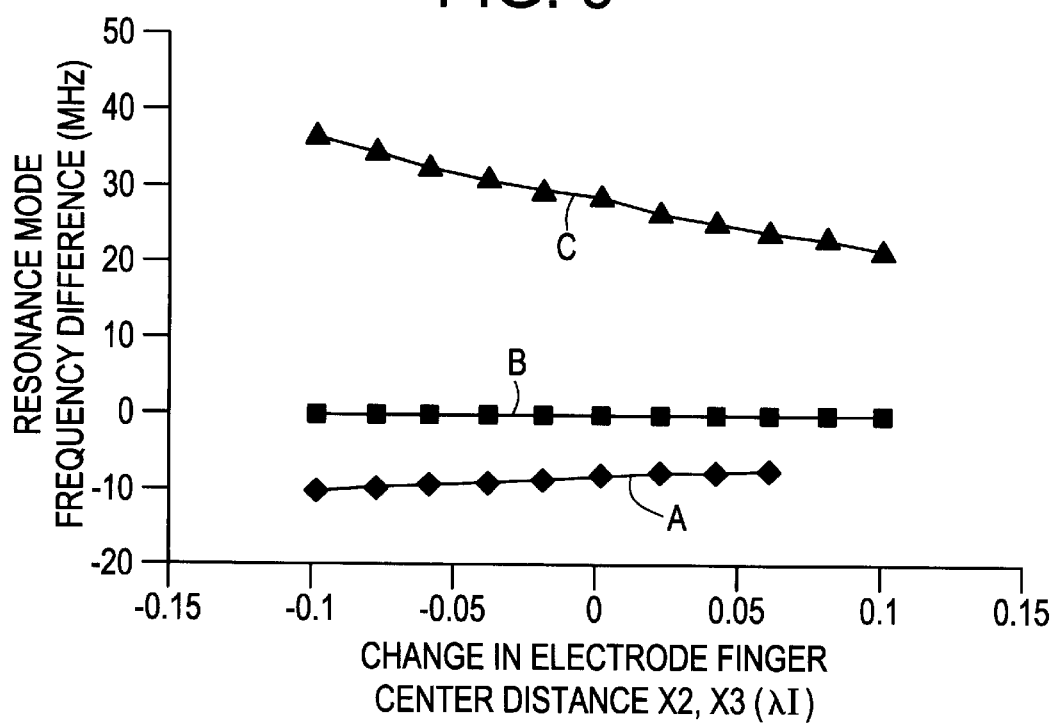
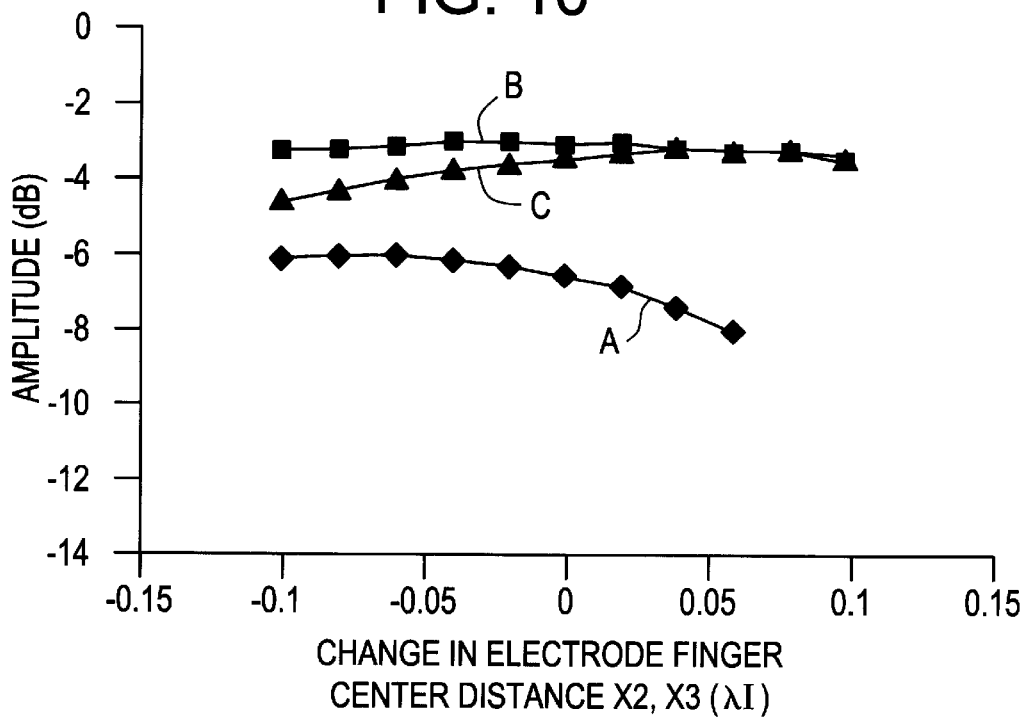

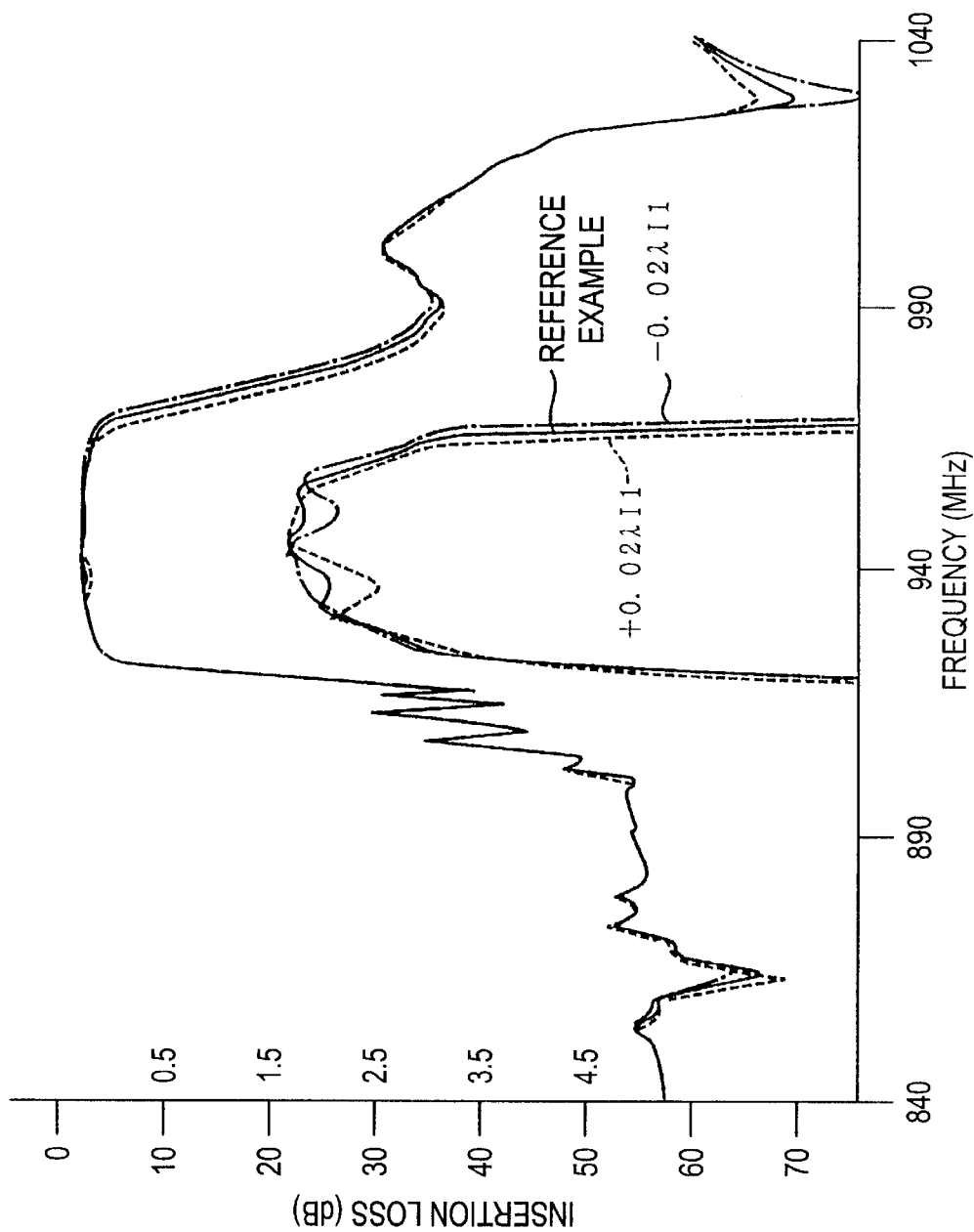

RESONANCE MODE
INDICATED BY ARROW B
(ZERO-OREDER MODE)

RESONANCE MODE
INDICATED BY ARROW A
(SECONDARY MODE)

RESONANCE MODE
INDICATED BY ARROW C

US 6,583,691 B2

LONGITUDINALLY COUPLED RESONATOR TYPE SURFACE ACOUSTIC WAVE FILTER WITH AN IDT HAVING A NARROW PITCH PORTION

BACKGROUND OF THE INVENTION

1. Field of the Invention

The present invention relates to a surface acoustic wave filter for use as a band-pass filter or other filter in an RF stage of a portable telephone or electronic apparatus, and more particularly, to a longitudinally coupled resonator type surface acoustic wave device having a plurality of interdigital transducers (IDTs) arranged in the propagation direction of a surface acoustic wave.

2. Description of the Related Art

As band-pass filters used in the RF stage of portable telephones, surface acoustic wave filters have been widely used. The band-pass filters are required to have a low loss, a high attenuation, and a wide band. Accordingly, various attempts to satisfy such requirements have been made in the surface acoustic wave filters.

For example, Japanese Unexamined Patent Application Publication No. 5-267990 discloses a method of increasing the band-width of a longitudinally coupled resonator type surface acoustic wave filter. FIG. 31 shows a longitudinally coupled resonator type surface acoustic wave filter 101 disclosed in the Japanese Unexamined Patent Application Publication No. 5-267990. A distance Z (hereinafter, referred to as an IDT-IDT interval) between the centers of adjacent electrode fingers in neighboring IDT's shown in FIG. 31 is set at about 0.25 times the wavelength $\lambda I$ which is determined by the pitch of the electrode fingers. FIGS. 27 and 28 are graphs for illustration of increasing a band-width in this conventional technique. FIG. 27 shows a relation between generated resonance mode frequencies. FIG. 28 schematically shows the effective current distributions at the respective resonance mode frequencies.

In the method of the above-described conventional technique, a resonance mode (resonance mode indicated by the arrow C) having peaks in the intensity distribution of a surface acoustic wave and presented in the IDT-IDT interval areas, is utilized, in addition to the zero-order mode (resonance mode indicated by the arrow B), and the secondary mode (resonance mode indicated by the arrow A) to form a pass band. Accordingly, ordinarily, the IDT-IDT interval is set at 0.50 $\lambda I$ to prevent undesired radiation of a bulk wave. As seen in the above-description of the conventional technique, the band can be widened by setting the interval at 0.25$\lambda I$.

FIGS. 29 and 30 illustrate changes in the resonance mode frequencies indicated by the arrows A to C, obtained when the IDT-IDT interval is varied. The results shown in FIGS. 29 and 30 are obtained and ascertained when the impedance matching conditions are intentionally deviated. It should be pointed out that the results shown in FIGS. 29 and 30 show relative changes in the resonance mode frequencies, not indicating the absolute positions of the accurate resonance mode frequencies.

FIG. 29 shows the shifts of the respective resonance mode frequencies on a basis of the zero-order mode frequency, caused when the IDT-IDT interval is varied, that is, changes in frequency difference between the respective resonance mode frequencies, on a basis of the resonance frequency in the zero-order mode. FIG. 30 shows changes in amplitude level between the respective resonance mode frequencies. As seen in FIGS. 29 and 30, all of the resonance mode frequencies and the amplitude levels are changed when the IDT-IDT interval is varied.

In the above-described conventional technique, the IDT-IDT interval is adjusted so as to increase the pass bandwidth. This will be described with reference to FIG. 32.

FIG. 32 is a schematic plan view illustrating one example of the conventional longitudinally coupled resonator type surface acoustic wave filter.

In this case, a surface acoustic wave filter 200 is produced by forming the respective electrodes made of Al on a 40±5° Y-cut X propagation LiTaO$_3$ substrate (not shown). The longitudinally coupled resonator type surface acoustic wave filter 200 has the configuration in which longitudinally coupled resonator type surface acoustic wave filter portions 201 and 202 are two-stage dependently connected. The surface acoustic wave filter portions 201 and 202 are configured in the same manner, and contains first, second, and third IDT's 205 to 207, and reflectors 208 and 209 provided on both of the sides of the first, second, and third IDT's 205 to 207. The surface acoustic wave filter portions 201 and 202 are designed in compliance with the following specifications.

electrode finger crossing-width: 43.41 $\lambda I$ ($\lambda I$ is the wavelength of a surface acoustic wave determined by the electrode finger pitch of an IDT)

the number of the electrode fingers of the IDT (the numbers are 25, 31, and 25 for the IDT's 205, 206, and 207, respectively)

the wavelength $\lambda I$ of an IDT: 4.17 $\mu$m wavelength $\lambda R$ for a reflector: 4.28 $\mu$m the number of electrode fingers of a reflector: 100 the intervals D and E between the neighboring IDT's: 0.32 $\lambda I$ the intervals between the IDT's and the reflectors: 0.50 $\lambda R$ duty in an IDT: 0.73 duty in a reflector: 0.55 duty in a reflector: 0.55 electrode film-thickness: 0.08 $\lambda I$

It should be noted that in this patent specification, all of the IDT-IDT intervals, the IDT—reflector intervals, and the intervals between adjacent electrode fingers are expressed as the distance between the centers of electrode fingers, respectively. The above-mentioned duty is defined as the ratio of the size in the width direction of an electrode finger along the surface acoustic wave propagation direction, based on the sum of the size in the width direction and the size of the space between the electrode finger and the adjacent electrode finger.

FIGS. 33 and 34 illustrate changes in characteristic of the surface acoustic wave transducer 200 shown in FIG. 32, obtained when the IDT-IDT intervals D and E are decreased by 0.005 $\lambda I$ as compared with the above-described design value to increase the bandwidth. The solid lines represents the characteristics obtained when the IDT intervals D and E are decreased, and the broken lines represent the characteristics obtained when the above specifications are applied.

FIG. 33 shows the frequency characteristics, and FIG. 34 shows changes in VSWR.

As seen in FIGS. 33 and 34, the pass bandwidth which corresponds to the range of from the through-level to 4 dB lower than the through-level is increased by about 1 MHz. However, the flatness of the insertion loss within the pass band is deteriorated, and moreover, the VSWR is reduced by about 0.25.

On the other hand, FIGS. 35 and 36 show changes in characteristics of the surface acoustic wave filter 200, obtained when the IDT-IDT intervals D and E are increased by 0.003 λI as compared with the abode-described design values, so that the flatness of the insertion loss within the pass band is enhanced, and the VSWR characteristic is improved. The solid lines represent the characteristics when the IDT intervals D and E are increased, and the broken lines show the characteristics obtained when the above-described specifications are applied.

As seen in FIGS. 35 and 36, the flatness of the insertion loss and the VSWR within the pass band can be improved by increasing the IDT-IDT intervals, while the pass bandwidth becomes narrow by about 1 MHz. The reason lies in that when it is attempted to produce a desired characteristic by adjustment of the IDT-IDT intervals, all of the resonance modes are changed, as seen in FIGS. 29 and 30.

That is, since the three resonance modes can not be individually operated, characteristics satisfying all of the pass bandwidth, the flatness of the insertion loss within the pass band, the VSWR, and so forth can not be obtained.

SUMMARY OF THE INVENTION

To overcome the above-described problems with the prior art, preferred embodiments of the present invention provide a longitudinally coupled resonator type surface acoustic wave filter which solves the above-described technical defects, and in which the arrangement of the above-described three resonance modes are widely adjustable, and the design flexibility of the pass bandwidth, the flatness of the insertion loss within the pass band, and the VSWR are greatly enhanced.

A preferred embodiment of the present invention provides a longitudinally coupled resonator type surface acoustic wave filter in which the flatness of the insertion loss within the pass band is greatly enhanced, and the VSWR characteristic is greatly improved without the pass bandwidth being decreased.

Another preferred embodiment of the present invention provides a longitudinally coupled resonator type surface acoustic wave filter in which the bandwidth can be increased without the flatness of the insertion loss and the VSWR characteristic within the pass band being deteriorated.

According to an aspect of the present invention, a longitudinally coupled resonator type surface acoustic wave filter is provided which comprises a piezoelectric substrate, and first, second, and third IDT's provided on the piezoelectric substrate to extend along the surface acoustic wave propagation direction and having plural electrode fingers, respectively, at least one of the first, second, and third IDT's containing at least one narrow pitch electrode finger portion in which the pitches of a portion of the electrode fingers arranged from the end of the IDT on the neighboring IDT side are shorter than that of the other portion of the electrode fingers in the IDT, the distance between the centers of at least one pair of adjacent electrode fingers differing from 0.25 λA+0.25 λB in which λA represents the wavelength determined by the pitch of one electrode finger, and λB represents the wavelength determined by the pitch of the other electrode finger.

In this case, at least one pair of the adjacent electrodes may be not only a pair of adjacent electrode fingers provided in the narrow pitch electrode finger portion and a remaining electrode finger portion neighboring on the narrow pitch electrode finger portion and a pair of the adjacent electrode fingers provided in neighboring IDT's, respectively, but also a pair of adjacent electrode fingers in an area other than that in which the above-mentioned adjacent electrode fingers are provided.

According to another aspect of the present invention, a longitudinally coupled resonator type surface acoustic wave filter is provided which comprises a piezoelectric substrate, and first, second, and third IDT's provided on the piezoelectric substrate to extend along the surface acoustic wave propagation direction and having plural electrode fingers, respectively, at least one of the first, second, and third IDT's including at least one narrow pitch electrode finger portion in which the pitches of a portion of the electrode fingers arranged from the end of the IDT on the neighboring IDT side are shorter than the other portion of the electrode fingers in the IDT, if λI2 represents the wavelength determined by the electrode finger pitch of the narrow pitch electrode finger portion, and λI1 represents the pitch of the electrode finger portion provided in the IDT including the narrow pitch electrode finger portion and being other than the narrow pitch electrode finger portion, the distance between the centers of the adjacent electrode fingers provided in the narrow pitch electrode finger portion and the electrode finger portion other than the narrow pitch electrode finger portion differing by 0.25 λI1+0.25 λI2.

According to another aspect of the present invention, a longitudinally coupled resonator type surface acoustic wave filter is provided which includes a piezoelectric substrate, and first, second, and third IDT's provided on the piezoelectric substrate to extend along the surface acoustic wave propagation direction and having plural electrode fingers, respectively, at least one of the first, second, and third IDT's including at least one narrow pitch electrode finger portion in which the pitches of a portion of the electrode fingers arranged from the end of the IDT on the neighboring IDT side are shorter than that of the other part of the electrode fingers in the IDT, in the case in which λI2 represents the wavelength determined by the electrode finger pitch of the narrow pitch electrode finger portion, and λI1 represents the pitch of the electrode finger portion provided in the IDT including the narrow pitch electrode finger portion and being other than the narrow pitch electrode finger portion, the distance between the centers of the adjacent electrode fingers provided in the narrow pitch electrode finger portion and a neighboring electrode finger portion differing by 0.25 λ1+0.25 λI2.

According to still another aspect of the present invention, a longitudinally coupled resonator type surface acoustic wave filter is provided which includes a piezoelectric substrate, and first, second, and third IDT's provided on the piezoelectric substrate to extend along the surface acoustic wave propagation direction and having plural electrode fingers, respectively, at least one of the first, second, and third IDT's including at least one narrow pitch electrode finger portion in which the pitches of a portion of the electrode fingers arranged from the end of the IDT on the neighboring IDT side are shorter than that of the other portion of the electrode fingers in the IDT, in the case in which λI2 represents the wavelength determined by the electrode finger pitch of the narrow pitch electrode finger portion, and λI1 represents the pitch of the electrode finger portion provided in the IDT including the narrow pitch electrode finger portion and being other than the narrow pitch electrode finger portion, the distance between the centers of the adjacent electrode fingers provided in the neighboring IDT's, respectively, being set to differ by 0.5 λI2, when the narrow pitch electrode finger portions are provided adjacently to each other in both of the neighboring IDT's, and moreover, differing by 0.25 $\lambda I1+0.25$ $\lambda I2$, when the narrow pitch electrode finger portion is provided in only one of the IDT's, the distance between the centers of the adjacent electrode fingers provided in the narrow pitch electrode finger portion and the electrode finger portion other than the narrow pitch electrode finger portion differing by 0.25 $\lambda I1+0.25$ $\lambda I2$.

Preferably, the deviation amount of the distance between the centers of the adjacent electrode fingers is up to 0.25 $\lambda I1$.

More preferably, the electrode covering ratio of one electrode finger of a pair of the adjacent electrode fingers provided in the neighboring IDT's is relatively high, wherein the gap between a pair of the adjacent electrode fingers is substantially reduced.

An area between a pair of the adjacent electrode fingers provided in the neighboring IDT's may be metallized.

According to another aspect of the present invention, a longitudinally coupled resonator type surface acoustic wave filter is provided which includes a piezoelectric substrate, and first, second, and third IDT's provided on the piezoelectric substrate to extend along the surface acoustic wave propagation direction and having plural electrode fingers, respectively, at least one of the first, second, and third IDT's including at least one narrow pitch electrode finger portion in which the pitches of a portion of the electrode fingers arranged from the end of the IDT on the neighboring IDT side are shorter than that of the other portion of the electrode fingers in the IDT, an electrode finger portion succeeding the narrow pitch electrode finger portion having a relatively wide electrode finger pitch, an electrode finger portion having a different electrode finger pitch being provided in the narrow pitch electrode finger portion.

Preferably, the distance between the centers of at least one pair of the adjacent electrode fingers provided in the narrow pitch electrode finger portions having different electrode finger pitches, respectively differing by 0.25 $\lambda A+0.25$ $\lambda B$, in which $\lambda A$ and $\lambda B$ represent the wavelengths determined by the respective electrode finger pitches.

Moreover, preferably, the narrow pitch electrode finger portion is a chirp type electrode finger portion. The chirp type electrode finger portion is configured to have electrode finger pitches arranged in the linearly decreasing order from the center in the surface acoustic wave propagation direction of the IDT toward the outside thereof.

According to the present invention, a longitudinally coupled resonator type surface acoustic wave filter is provided which includes plural longitudinally coupled resonator type surface acoustic wave filters described above and plural-stage dependently connected.

Furthermore, according to the present invention, a communication device is provided which uses a longitudinally coupled resonator type surface acoustic wave filters described above.

Other elements, characteristics, features and advantages of the present invention will become more apparent from the following detailed description of preferred embodiments of the present invention with reference to the attached drawings.

BRIEF DESCRIPTION OF THE DRAWINGS

FIG. 9 is a graph showing changes in frequency positional relation between the three resonance modes obtained when the inter-center distances X2 and X3 are varied in the longitudinally coupled resonator type surface acoustic wave filter shown in FIG. 4.

FIG. 10 is a graph showing changes in amplitude level between the three resonance modes obtained when the inter-center distances X2 and X3 are varied in the longitudinally coupled resonator type surface acoustic wave filter shown in FIG. 4.

FIG. 11 is a graph showing changes in frequency characteristic obtained when the inter-center distances X1 and X4 are varied from the basic design values in the longitudinally coupled resonator type surface acoustic wave filter shown in FIG. 4.

DETAILED DESCRIPTION OF PREFERRED EMBODIMENT

Hereinafter, the present invention will be more apparent from the following description of concrete preferred embodiments of the present invention made with reference to the drawings.

Figure 1:
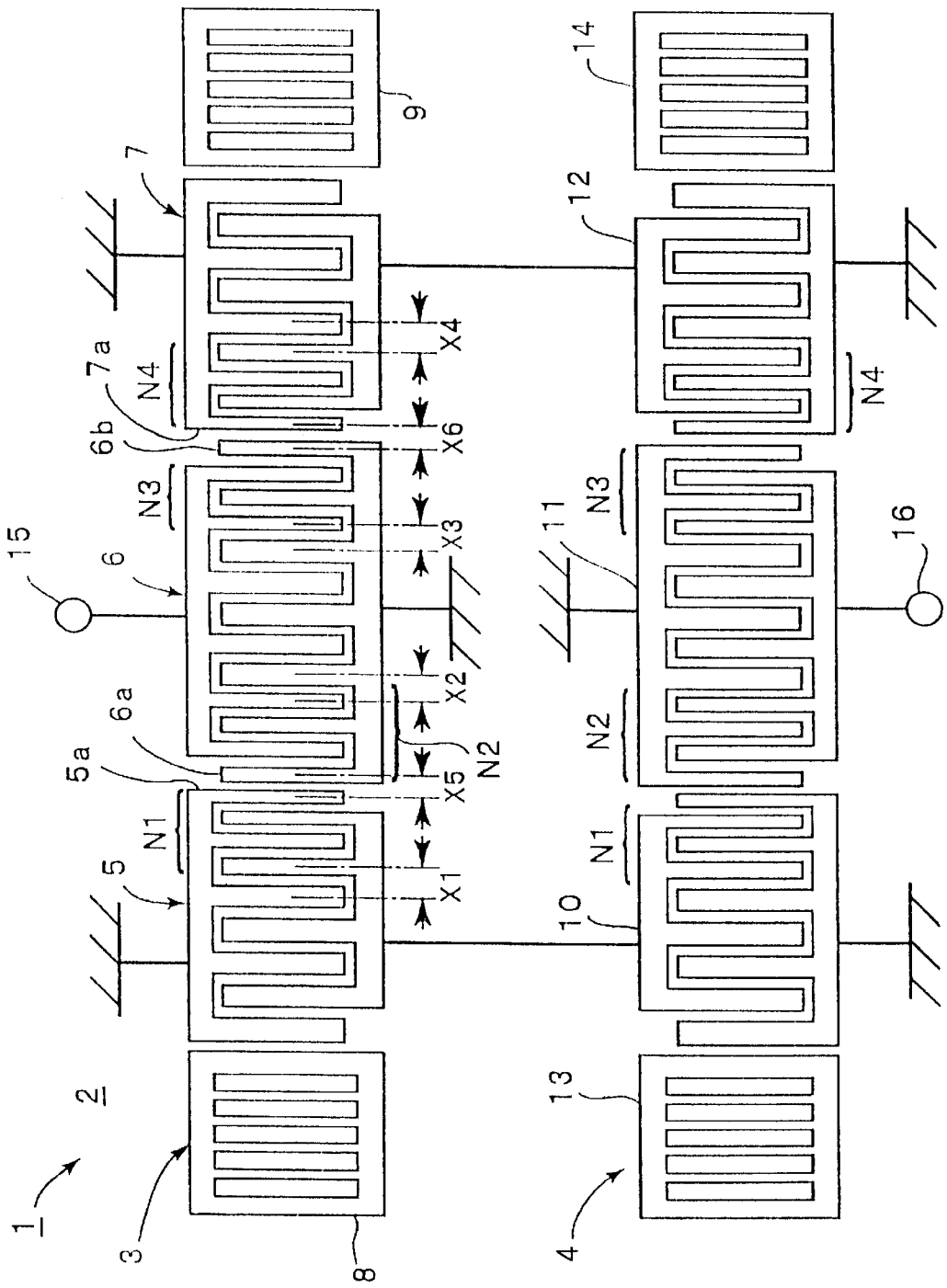
FIG. 1 is a schematic plan view of a longitudinally coupled resonator type surface acoustic wave filter according to a first preferred embodiment.

FIG. 1 is a schematic plan view of a longitudinally coupled resonator type surface acoustic wave filter according to a first preferred embodiment of the present invention. The longitudinally coupled resonator type surface acoustic wave filters of this and the succeeding preferred embodiments are EGSM reception band-pass filters. However, the longitudinally coupled resonator type surface acoustic wave filters of the present invention are not limited to the above filters, and can be used as a band-pass filter in various uses.

In this preferred embodiment, a longitudinally coupled resonator type surface acoustic wave filter 1 is provided, using a 40±5° Y cut X propagation $LiTaO_3$ substrate 2 as the piezoelectric substrate.

In the surface acoustic wave filter 1, surface acoustic wave filter portions 3 and 4 are two-stage dependently connected. The surface acoustic wave filter portions 3 and 4 are longitudinally coupled resonator type surface acoustic wave filters having three IDT's, respectively. Both of the filters 3 and 4 have substantially the same configuration.

In the surface acoustic wave filter 3, the first, second, and third IDT's 5, 6, and 7 are arranged in the surface acoustic wave propagation direction. Reflectors 8 and 9 are arranged on both of the sides of the area in which the IDT's 5, 6, and 7 are provided.

Similarly, in the surface acoustic wave filter 4, the first, second, and third IDT's 10, 11, and 12 are arranged. Reflectors 13 and 14 are arranged on both of the sides of the area in which the IDT's 10, 11, and 12 are provided.

One end of the second IDT 6 in the center of the surface acoustic wave filter portion 3 is connected to an input terminal 15. Also, one end of the first and third IDT's 5 and 7 in the surface acoustic wave filter portion 3 are electrically connected to one end of the first and third IDT's 10 and 12 in the surface acoustic wave filter portion 4. One end of the second IDT 11 in the surface acoustic wave filter portion 4 is electrically connected to an output terminal 16. All of the ends of the IDT's 5 to 7 and 10 to 12 which are on the sides opposite to the ends thereof which are connected to the input terminal 15, the output terminal 16, and the other IDT's are connected to a ground potential, respectively.

In the surface acoustic wave filter portion 3, the IDT's 5 to 7 have narrow pitch electrode finger portions in which the electrode finger pitches are relatively narrow. For example, electrode fingers 5a and 6a are adjacent to each other in the area where the IDT's 5 and 6 are adjacent to each other. Several electrode fingers of the IDT 5 including the electrode finger 5a, arranged from the end thereof on the IDT 6 side, define an narrow pitch electrode finger portion N1 in which the electrode finger pitches are narrow as compared with the pitches of the remaining electrode fingers of the IDT 5. That is, in the IDT 5, the electrode finger pitch in the narrow pitch electrode finger portion N1 is set to be narrower than the electrode finger pitch in the remaining electrode finger portion.

Similarly, in the IDT 6, several electrode fingers thereof including the electrode finger 6a, arranged from the end thereof on the IDT 5 side define a narrow pitch electrode finger portion N2.

On the other hand, in the area where the IDT's 6 and 7 are adjacent to each other, the electrode finger 6b of the IDT 6 and the electrode finger 7a of the IDT 7 are adjacent to each other. Several electrode fingers of the ITD 6 including the electrode finger 6b at the end thereof on the IDT 7 side define a narrow pitch electrode finger portion N3. Thus, the narrow pitch electrode finger portions N2 and N3 are provided on both of the sides in the surface acoustic wave propagation direction of the IDT 6. The electrode finger pitches in the narrow pitch electrode finger portions N2 and N3 are narrow as compared with the electrode finger pitch of the electrode finger portion in the center of the IDT 6. The electrode finger pitches of the narrow pitch electrode finger portions N2 and N3 are set to be the same.

In the IDT 7, a narrow pitch electrode finger portion N4 is provided. The narrow pitch electrode finger portion N4 includes plural electrode fingers at the end thereof on the IDT 6 side. In the IDT 7, the electrode finger pitch in the narrow pitch electrode finger portion N4 is narrower than that in the remaining electrode finger portion thereof.

In the IDT's 10 to 12, the narrow pitch electrode finger portions N1, N2, N3, and N4 are provided as well as the IDT's 5 to 7.

For brief illustration, the number of the electrode fingers shown in FIG. 1 is smaller as compared with that of practical electrode fingers.

First, a basic design example (hereinafter, referred to as a reference example) of a longitudinally coupled resonator type surface acoustic wave filter 1, which is not an example of the present invention, will be described. The wavelength determined by the electrode finger pitch in the narrow pitch electrode finger portions N1 to N4 is designated by $\lambda I2$. The wavelength determined by the electrode finger pitch in the other electrode finger portions is designated by $\lambda I1$.

The electrode finger crossing width W in the IDT's 5 to 7 and 10 to 12 is 35.8 $\lambda I1$.

Referring to the numbers of the electrode fingers in the IDT's 5, 7, 10, and 12, the number of electrode fingers in the respective narrow pitch electrode finger portions is 4, and that of the electrode fingers in the respective remaining electrode finger portion is 25.

Referring to the numbers of electrode fingers in the IDT's 6 and 11, the number of electrode fingers in each of the narrow pitch electrode finger portions N2 and N3 provided in both of the sides, respectively, is 4. The number of electrode fingers in the electrode finger portion in the center thereof, which is not the narrow pitch electrode finger portion, is 27.

The $\lambda I1$ is 4.19 $\mu$m.

The $\lambda I2$ is 3.90 $\mu$m.

The wavelength $\lambda R$ of the reflectors 8, 9, 13, and 14 is 4.29 $\mu$m. The number of electrode fingers in the respective reflectors is 100.

The electrode finger inter-center distance which is the distance between the centers of a pair of the adjacent electrode fingers provided in a narrow pitch electrode finger portion and the remaining electrode finger portion is equal to the sum of 0.25 $\lambda I1$ and 0.25 $\lambda I2$. The inter-center distance between the centers of a pair of the adjacent electrode fingers provided in a narrow pitch electrode finger portion and the remaining electrode finger portion is indicated by the arrow X1, X2, X3, or X4 in FIG. 1. For example, the distance is between the centers of a pair of the adjacent electrode fingers provided in the area where the narrow pitch electrode finger portion N1 of the IDT 5 and the remaining electrode finger portion thereof are adjacent to each other.

The neighboring IDT-IDT interval is 0.50 $\lambda I2$. In particular, in this embodiment, narrow pitch electrode finger portions are provided in both of the ends of IDT's which are neighboring to each other, respectively. The distance between the centers of the adjacent electrode fingers provided in neighboring IDT's, indicated by arrow X5 or X6, is set at 0.50 $\lambda I2$.

The interval between an IDT and the reflector is 0.50 $\lambda R$.

The duty in the IDT's 5 to 7 and 10 to 12 is 0.73. The duty in the reflectors is 0.55.

The electrode film-thickness is 0.08 $\lambda I1$.

In this example, each of the distances X5 and X6 between the centers of the adjacent electrode fingers provided in neighboring IDT's, and each of the distances X1 to X4 between the centers of the adjacent electrode fingers provided in neighboring electrode finger portions with different electrode finger pitches are set as the sum of 0.25 times each of the wavelengths which are determined by the electrode finger pitches in the electrode finger portions each including a pair of the adjacent electrode fingers. The reason lies in that the continuity of the propagation path of a surface acoustic wave is maintained, and the loss caused by radiation of a bulk wave is greatly reduced.

In the longitudinally coupled resonator type surface acoustic wave filter of this reference example, the loss is low, and a wider pass band is produced by using the above-mentioned three resonance modes, as compared with the conventional longitudinally coupled resonator type surface acoustic wave filter.

According to this preferred embodiment, in the longitudinally coupled resonator type surface acoustic wave filter of the above reference example, each of the inter-center distances X1 to X6 deviates from the sum of 0.25 times the wavelength which is determined by the pitch of plural electrode fingers including one of a pair of the adjacent electrode fingers and arranged to be farther from the center of one of the adjacent electrode fingers, and 0.25 times the wavelength which is determined by the pitch of plural electrode fingers containing the other of the adjacent electrode fingers and arranged to be farther from the center of the other of the adjacent electrode fingers. This will be described more concretely below.

Dispersions in insertion loss and the VSWR within the pass band are greatly improved by adjusting the inter-center distances X1 to X6 in the above-described reference example used as a basic design.

In this embodiment, the electrode finger crossing width is set at 43.0 $\lambda I1$. The inter-center distances X1 to X6 are set as follows:

each of inter-center distances X1 and X4=0.25 $\lambda X I1$+0.25 $\lambda I2$+0.015 $\lambda I1$;

each of inter-center distances X5 and X6=0.50 $\lambda I2$−0.020 $\lambda I1$; and each of inter-center distances X2 and X3=0.25 $\lambda I1$+0.25 $\lambda I2$+0.010 $\lambda I1$.

To achieve impedance-matching, the electrode finger crossing width is changed as described above.

Figure 2:
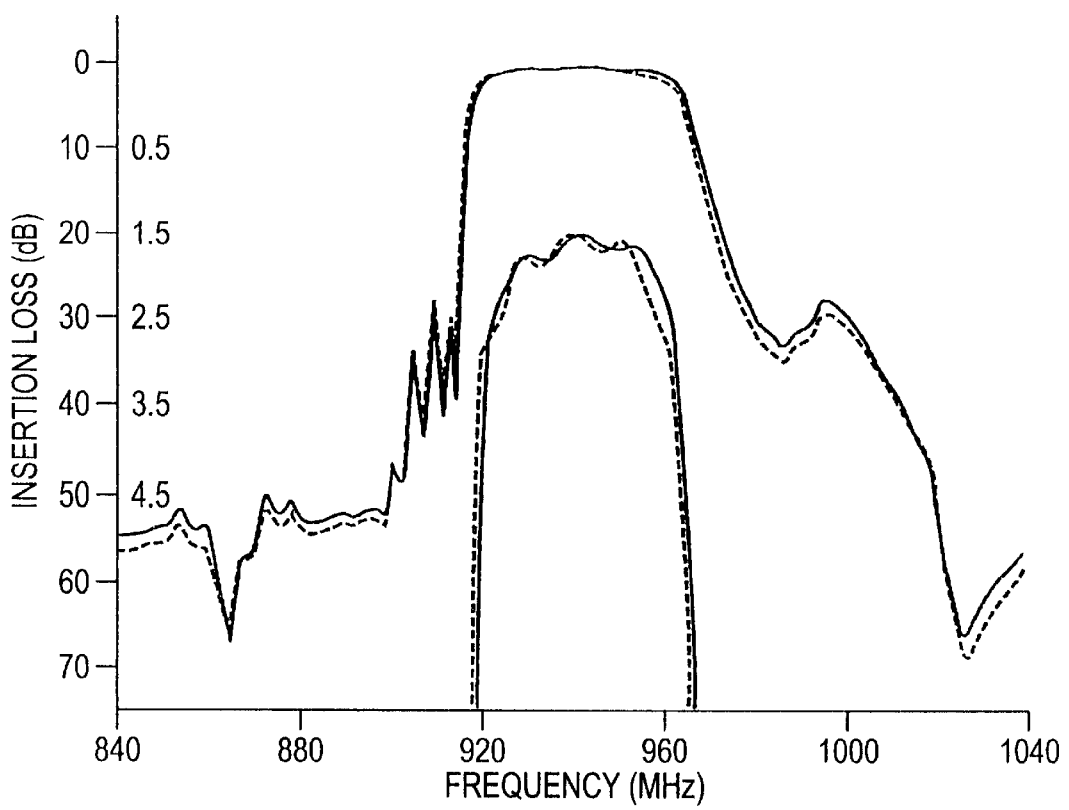
FIG. 2 is a graph showing the frequency characteristics of the longitudinally coupled resonator type surface acoustic wave filters of the first preferred embodiment and a reference example.
Figure 3:
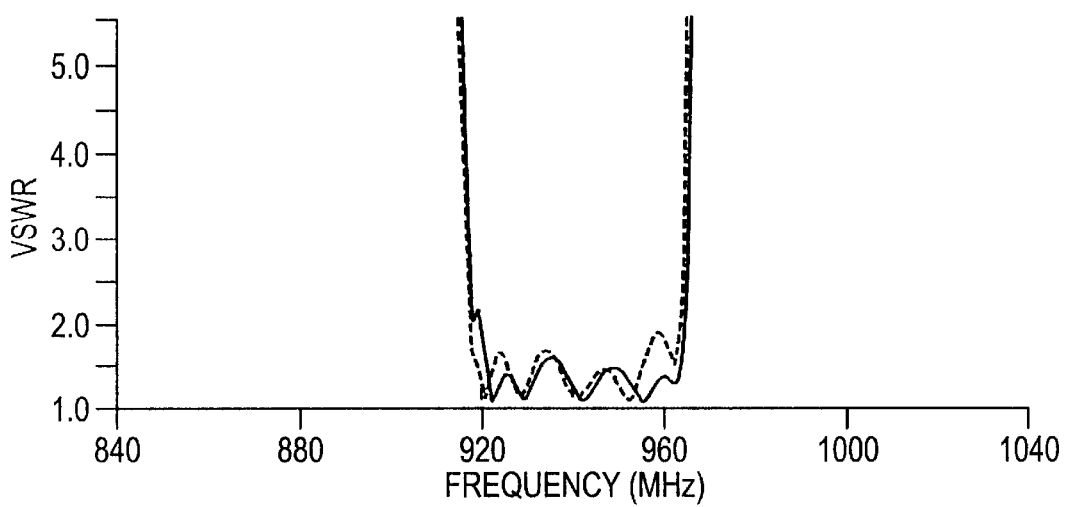
FIG. 3 is a graph showing the VSWR's of the longitudinally coupled resonator type surface acoustic wave filters of the first preferred embodiment and the reference example.

FIG. 2 shows the frequency characteristics of the longitudinally coupled resonator type surface acoustic wave filter of this preferred embodiment and the above-described reference example. FIG. 3 shows the VSER characteristics thereof. In FIGS. 2 and 3, the solid lines represent the results obtained in the first preferred embodiment, and the broken lines represent the results of the above reference example. FIG. 2 also shows the frequency characteristics magnified at the scale listed on the right side of the ordinate axis.

As seen in FIGS. 2 and 3, according to this example, dispersions in insertion loss are greatly reduced, and the VSWR is improved by about approximately 0.3 in the pass band. Moreover, the pass bandwidth which corresponds to the range of from the through-level to the attenuation 4 dB lower than the through-level is substantially the same as that of the reference example.

In this example, each of the distances X1 to X4 between the centers of a pair of the adjacent electrode fingers provided in a narrow pitch electrode finger portion and the electrode finger portion having a pitch different from that of the narrow pitch electrode finger portion is set to be greater than that of the reference example. That is, each of the distances X1 to X4 is set to be greater than the sum of 0.25 times each of the wavelengths which are determined by the respective electrode finger pitches in a pair of the adjacent electrode fingers, and moreover, each of the distances X5 and X6 between the centers of a pair of the adjacent electrode fingers provided in neighboring IDT's is set to be greater than the above design value. Thereby, dispersions in insertion loss and the VSWR are greatly enhanced in the pass-band. That is, dispersions in insertion loss and the VSWR are greatly improved in the pass-band without the pass band being narrowed.

The above-described advantages will be described with reference to FIGS. 4 to 10.

Figure 4:
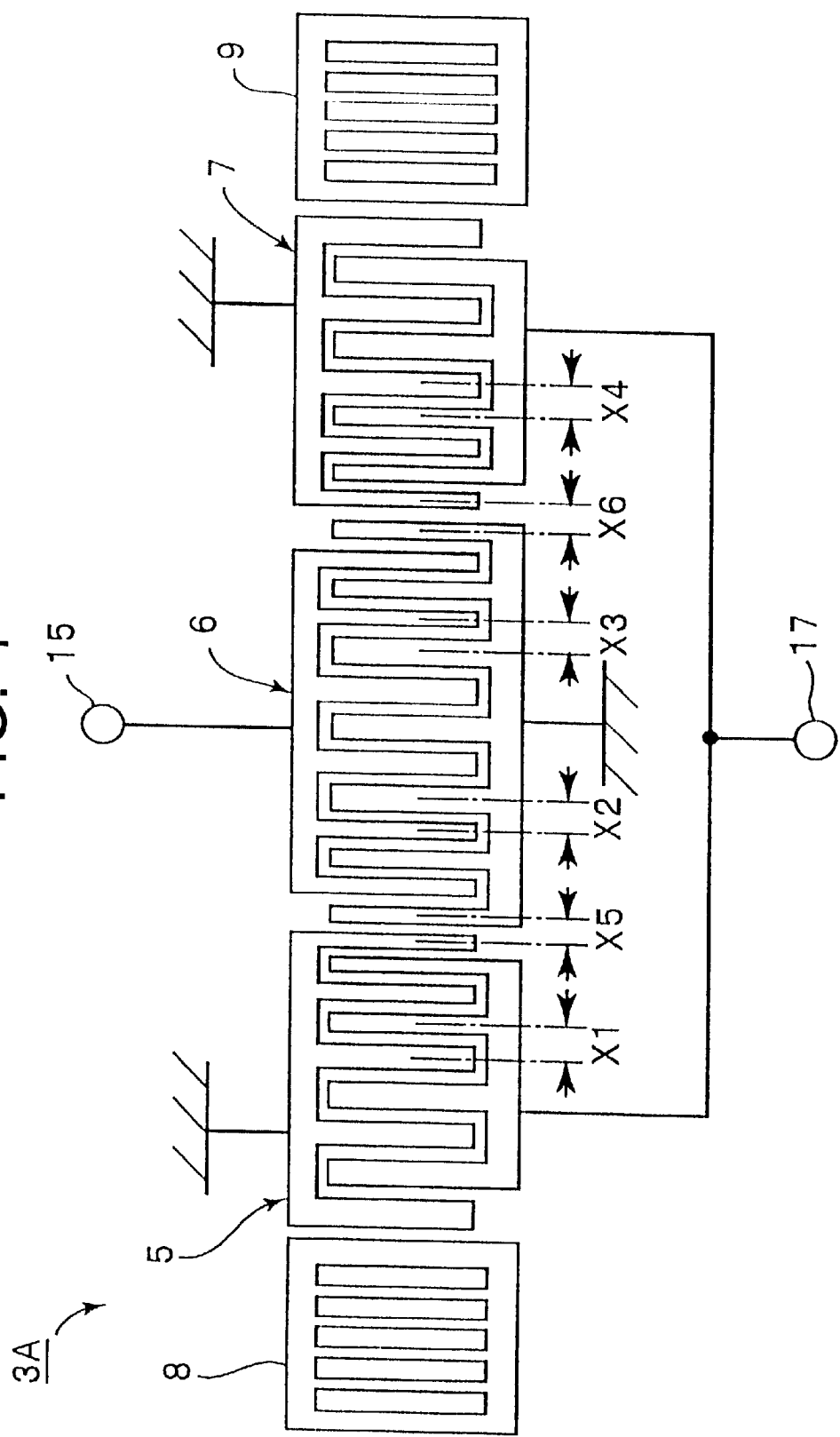
FIG. 4 is a schematic plan view illustrating the principle of the first preferred embodiment.

FIG. 4 shows the features of the surface acoustic wave filter portion 3 only removed from the longitudinally coupled resonator type surface acoustic wave filter 1 shown in FIG. 1.

In a longitudinally coupled resonator type surface acoustic wave filter portion 3A shown in FIG. 4, one end of the IDT's 5 and 7 are connected to an output terminal 17.

Figure 27:
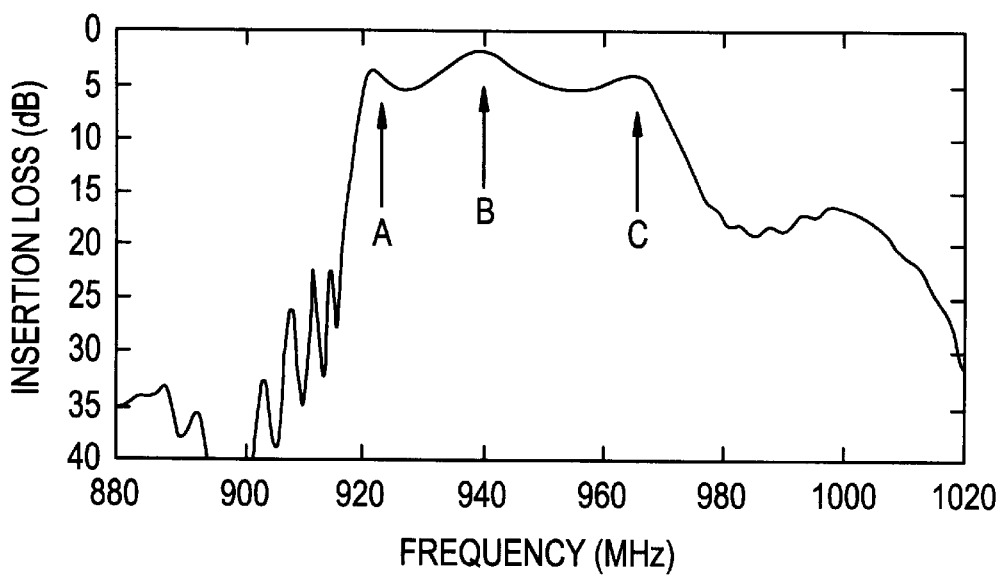
FIG. 27 is a graph showing a relation between the three resonance mode frequencies in the longitudinally coupled resonator type surface acoustic wave filter.
Figure 28:
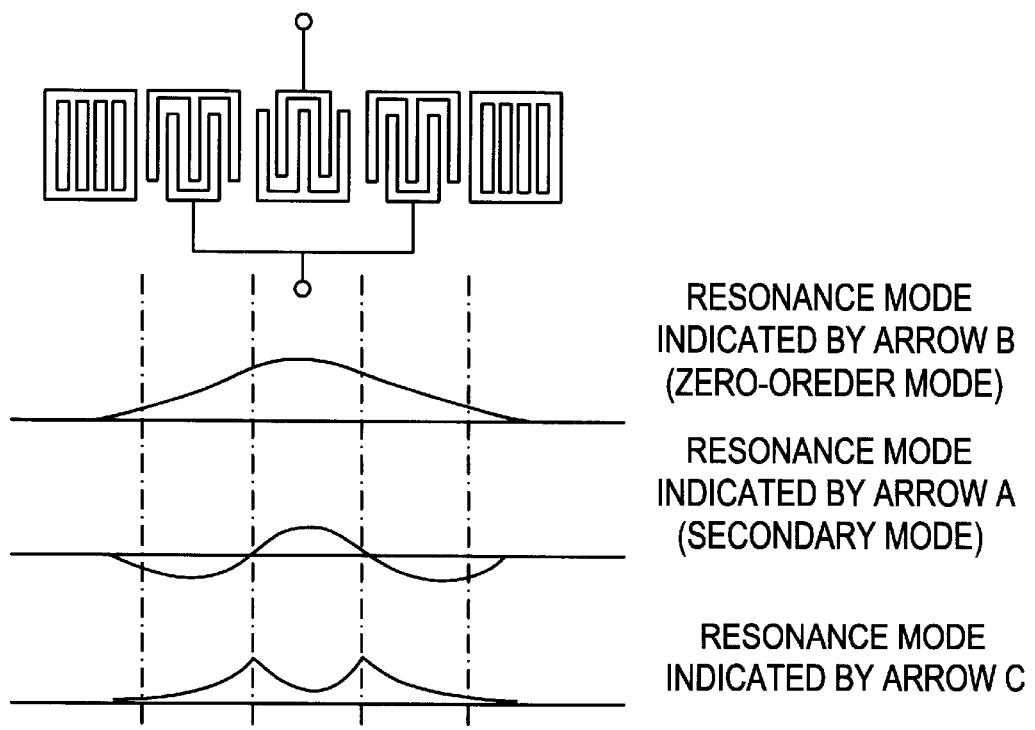
FIG. 28 illustrates the effective current distributions in the three resonance modes shown in FIG. 27.
Figure 29:
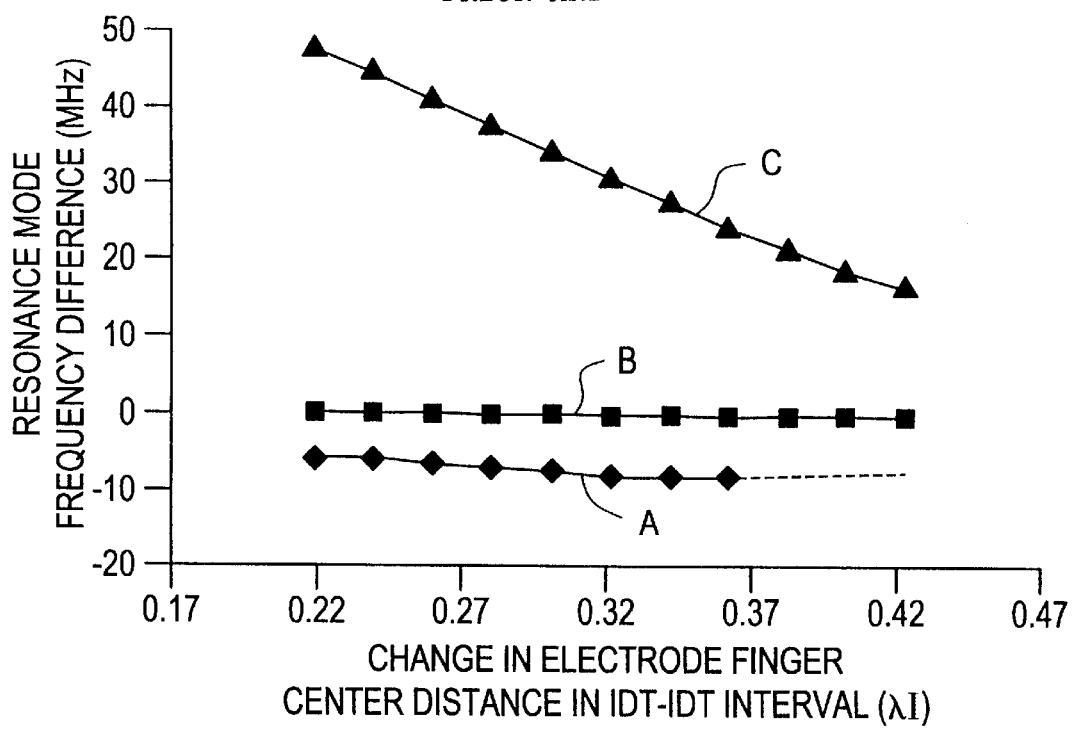
FIG. 29 is a graph showing a relation between an IDT-IDT interval and resonance mode frequency positions in a conventional longitudinally coupled resonator type surface acoustic wave filter.
Figure 30:
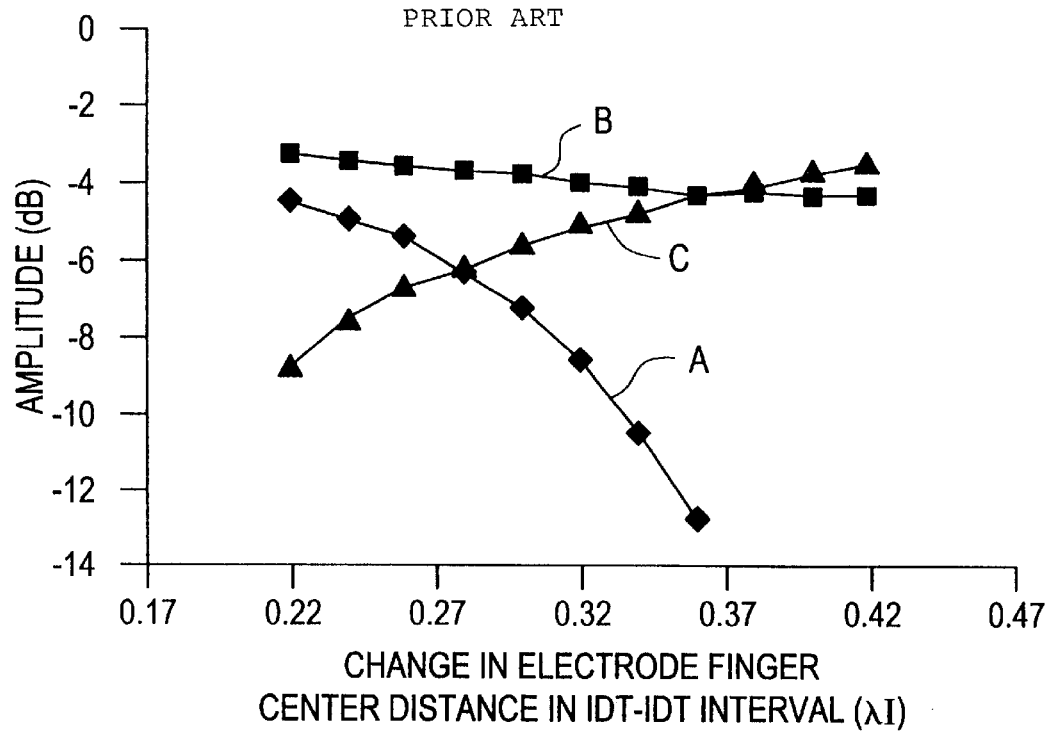
FIG. 30 is a graph showing a relation between an IDT-IDT interval and amplitude levels in the three resonance modes in the conventional longitudinally coupled resonator type surface acoustic wave filter.
Figure 31:
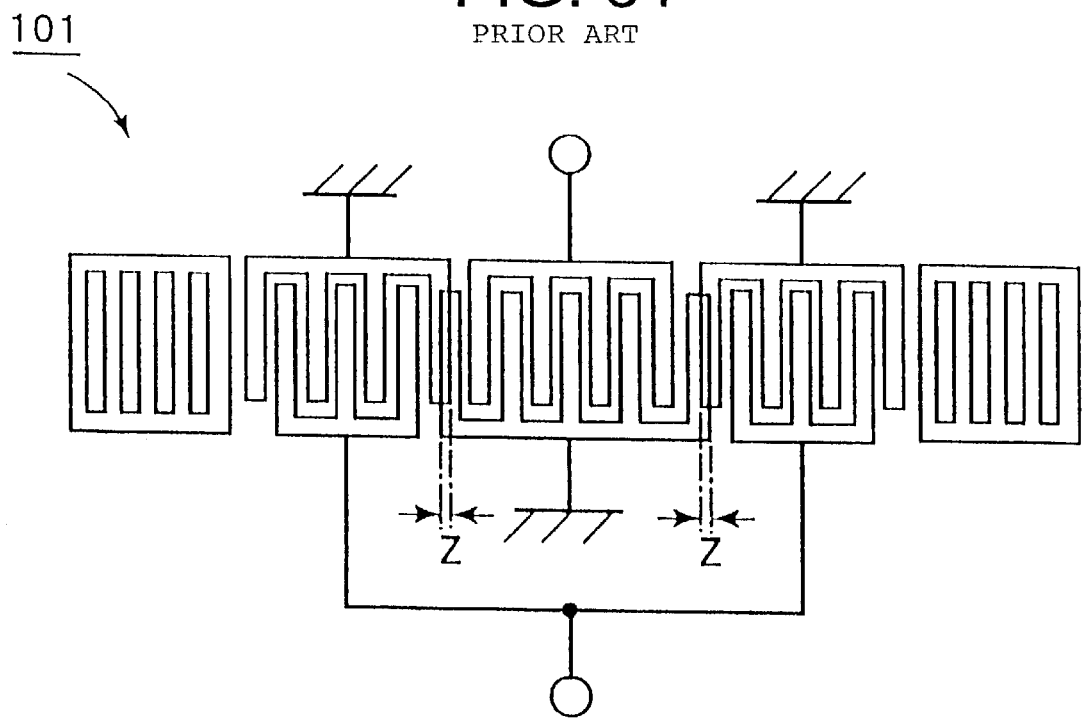
FIG. 31 is a schematic plan view showing an example of the conventional longitudinally coupled resonator type surface acoustic wave filter.
Figure 32:
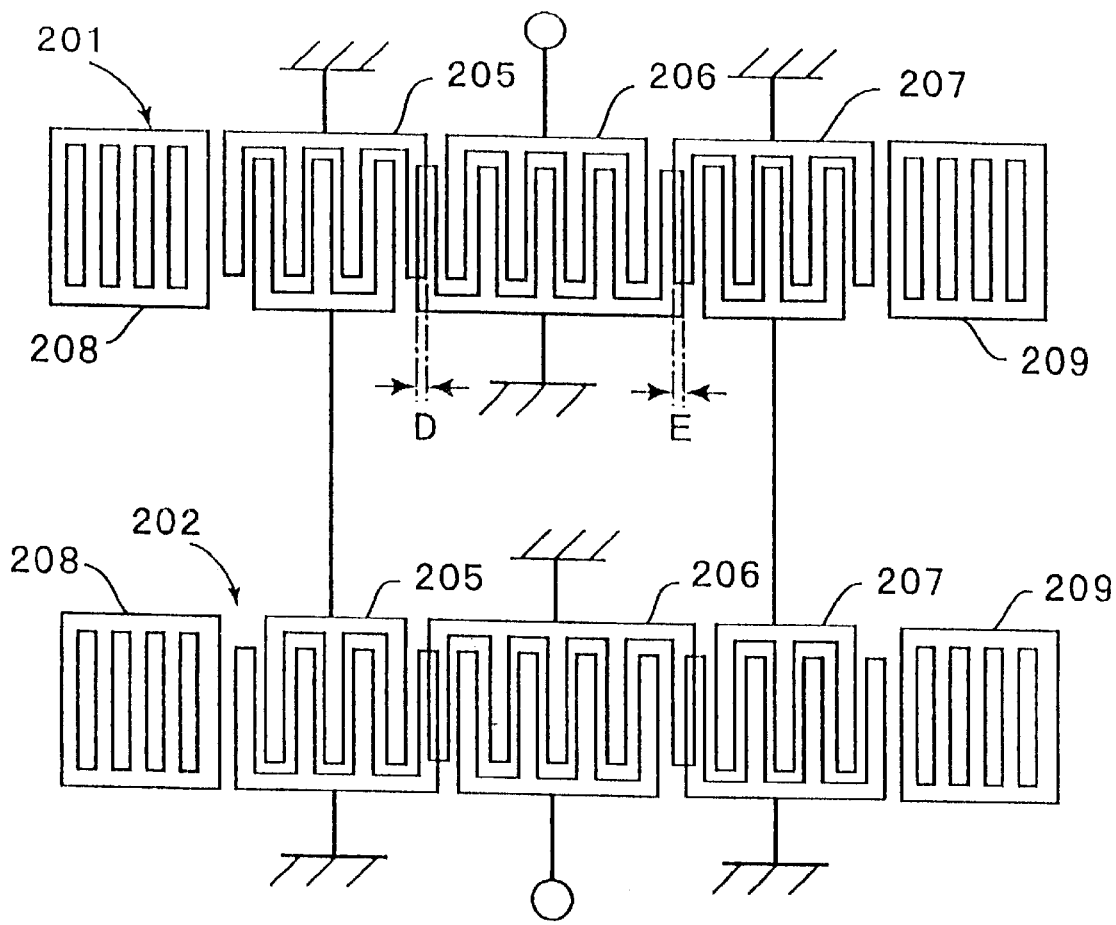
FIG. 32 is a schematic plan view showing another example of the conventional longitudinally coupled resonator type surface acoustic wave filter.
Figure 33:
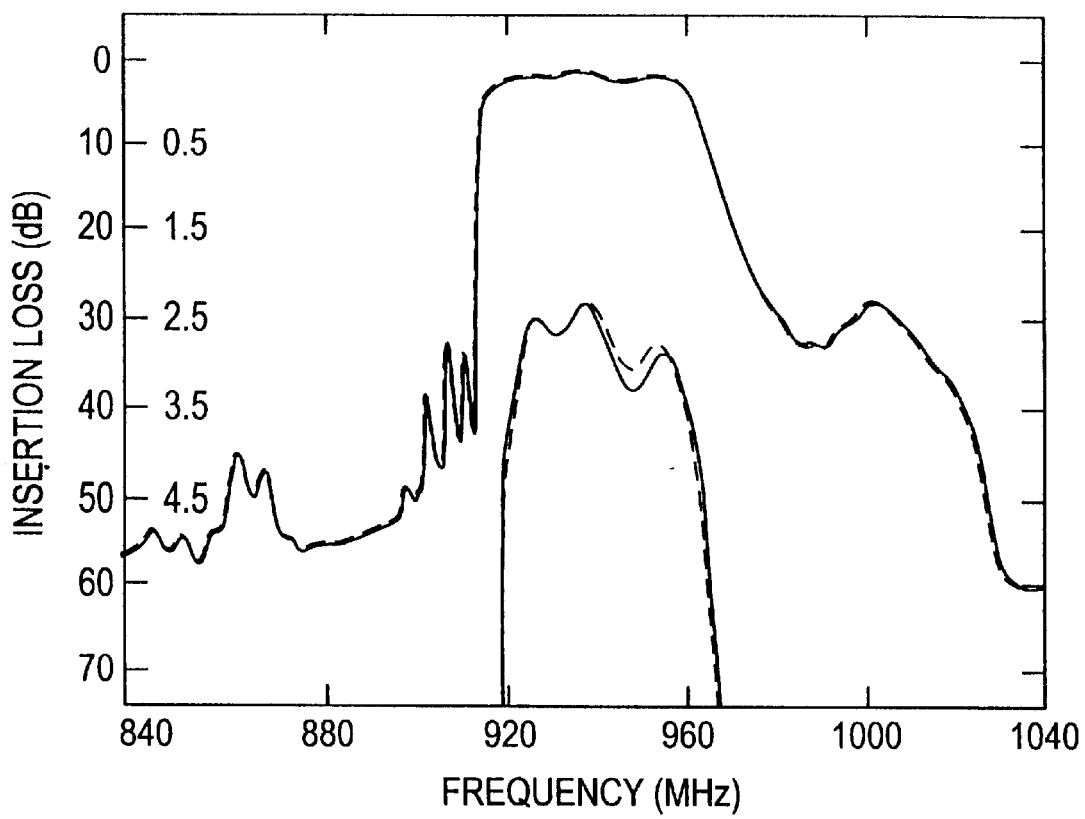
FIG. 33 is a graph illustrating changes in frequency characteristic obtained when the IDT-IDT interval is changed in the conventional longitudinally coupled resonator type surface acoustic wave filter.
Figure 34:
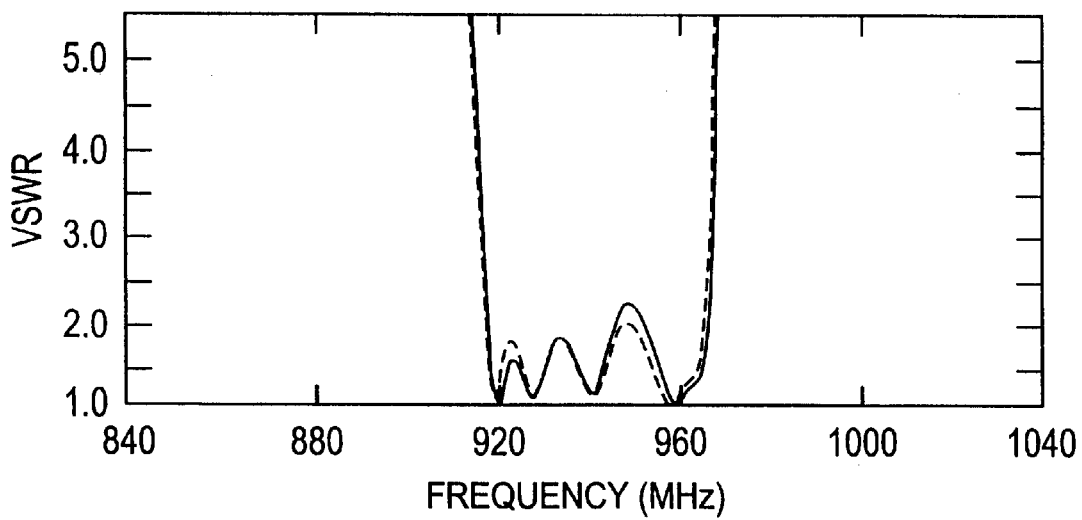
FIG. 34 is a graph illustrating changed in VSWR obtained when the IDT-IDT interval is changed in the conventional longitudinally coupled resonator type surface acoustic wave filter.
Figure 35:
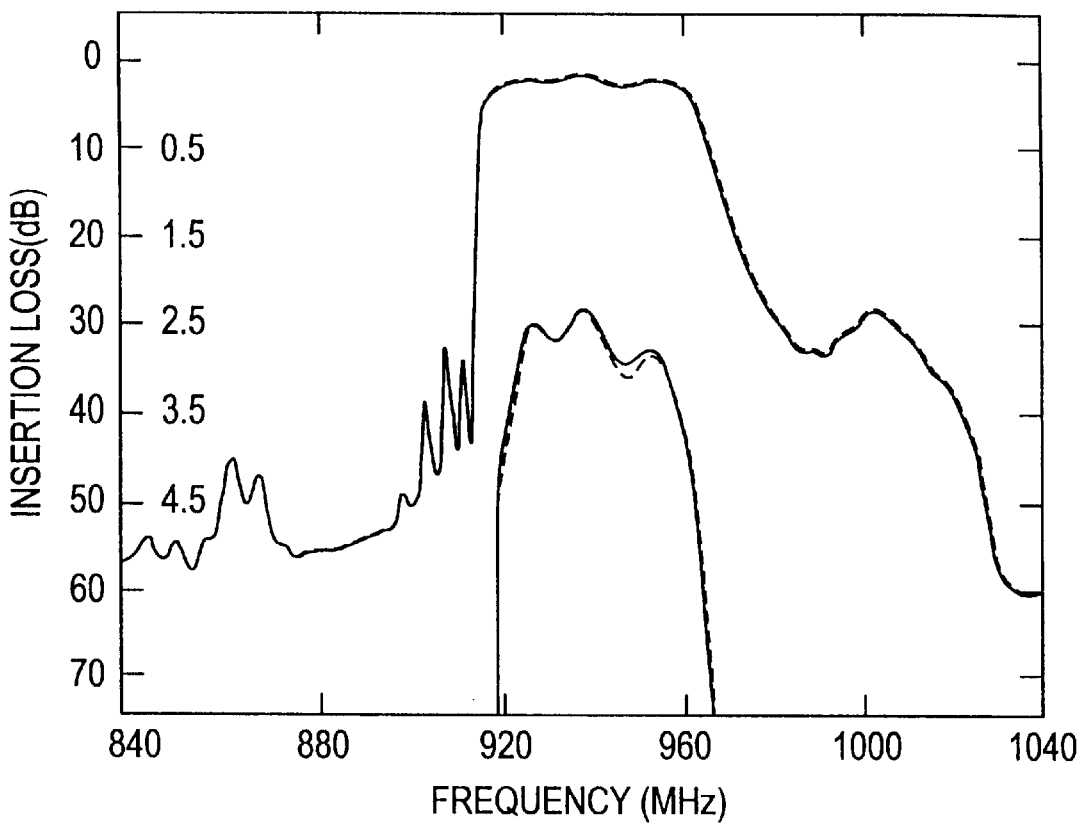
FIG. 35 is a graph illustrating changes in frequency characteristic, obtained when the IDT-IDT interval is changed in the conventional longitudinally coupled resonator type surface acoustic wave filter.
Figure 36:
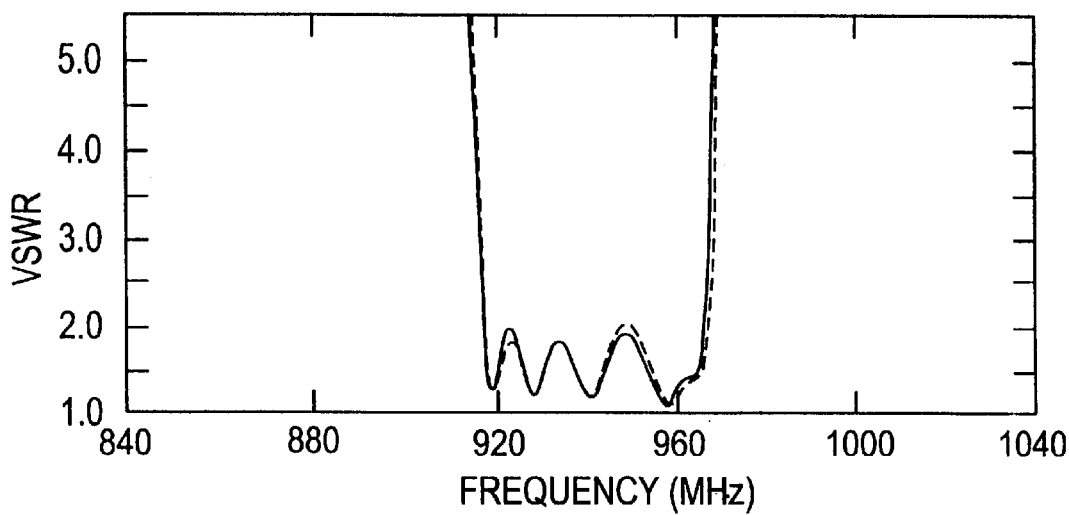
FIG. 36 is a graph illustrating changes in VSWR, obtained when the IDT-IDT interval is changed in the conventional longitudinally coupled resonator type surface acoustic wave filter.

FIGS. 5 to 10 show changes in the frequencies in the resonance modes A to C (the resonance modes A to C shown in FIGS. 27 and 28) produced when the electrode finger inter-center distances X1 to X6 are varied as well as the longitudinally coupled resonator type surface acoustic wave filter of FIG. 1.

Here, the term of "changes in the electrode finger inter-center distance" means the distance which is changed, based on the design value of the above-described reference example. FIGS. 5 to 10 show the results obtained when the impedance of 50 Ω is exchanged for an impedance of 5 Ω for deviation from the matching condition. Thus, it should be pointed out that the results of FIGS. 5 to 10 show the relative positions, not the correct absolute positions of the resonance mode frequencies.

Figure 5:
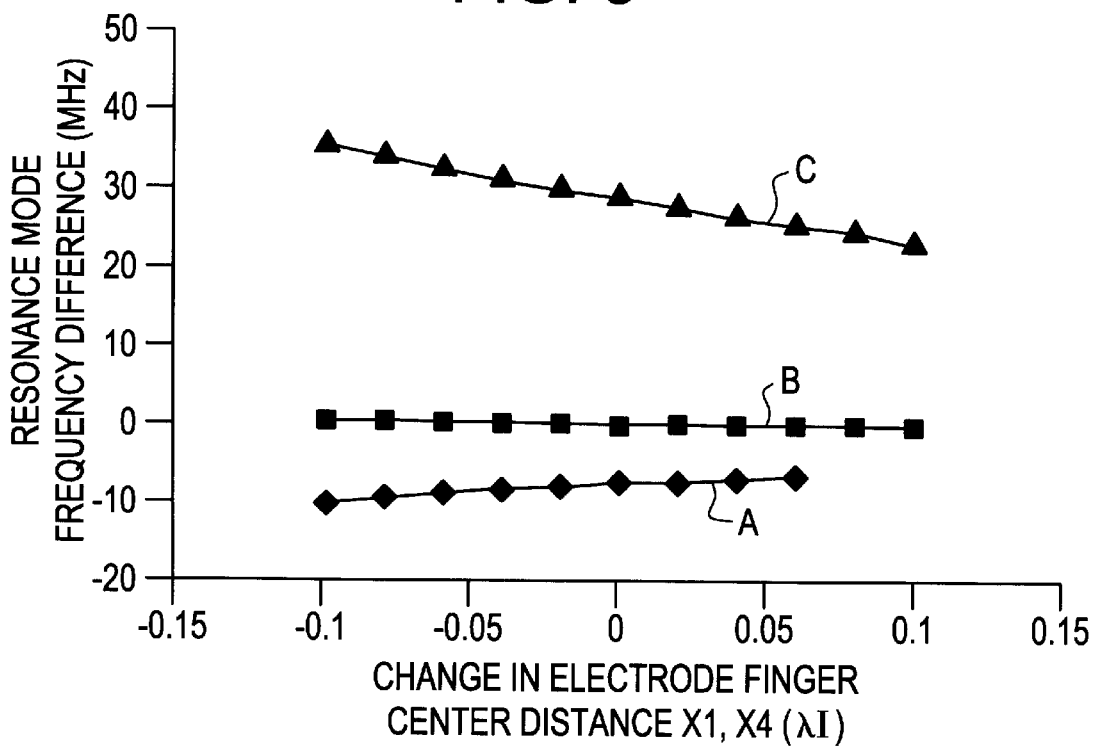
FIG. 5 is a graph illustrating changes in frequency positional relation between three resonance modes obtained when the inter-center distances X1 and X4 are varied in the longitudinally coupled resonator type surface acoustic wave filter shown in FIG. 4.
Figure 6:
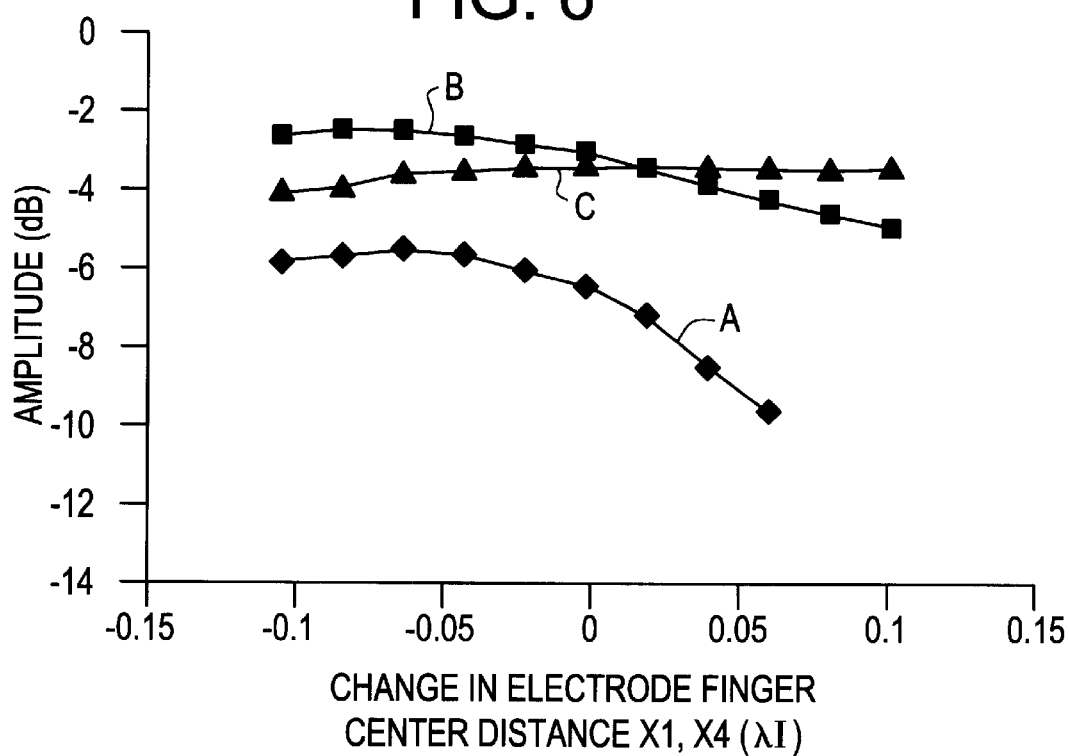
FIG. 6 is a graph showing changes in amplitude level of the three resonance modes, obtained when the inter-center distances X1 and X4 are varied in the longitudinally coupled resonator type surface acoustic wave filter shown in FIG. 4.
Figure 7:
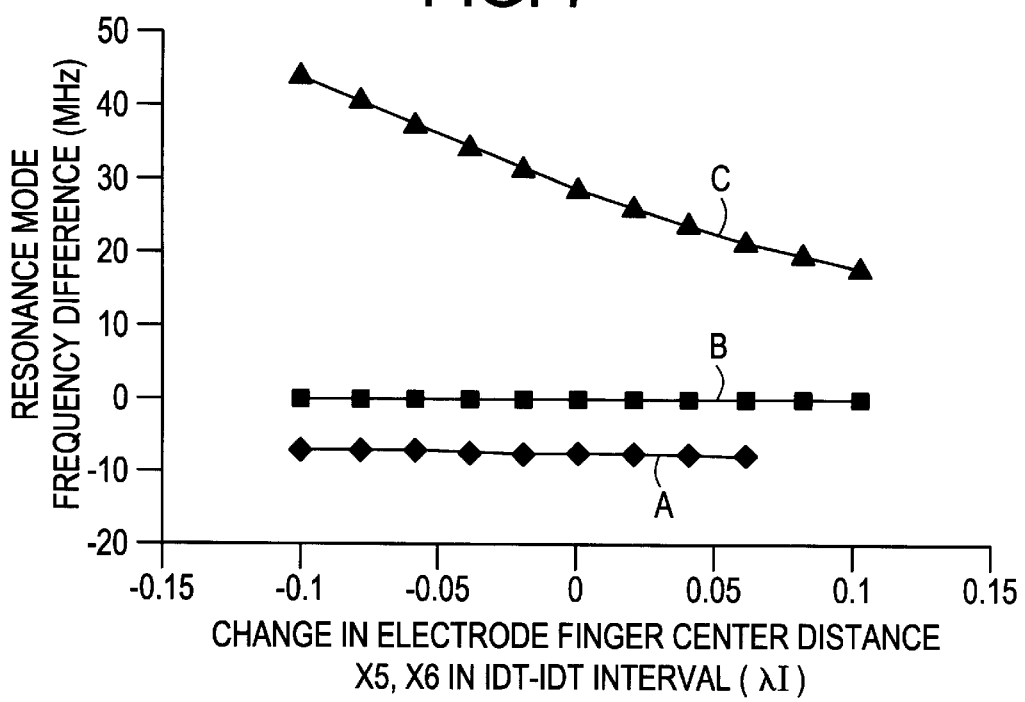
FIG. 7 is a graph showing changes in frequency positional relation between the three resonance modes obtained when the inter-center distances X5 and X6 are varied in the longitudinally coupled resonator type surface acoustic wave filter shown in FIG. 4.
Figure 8:
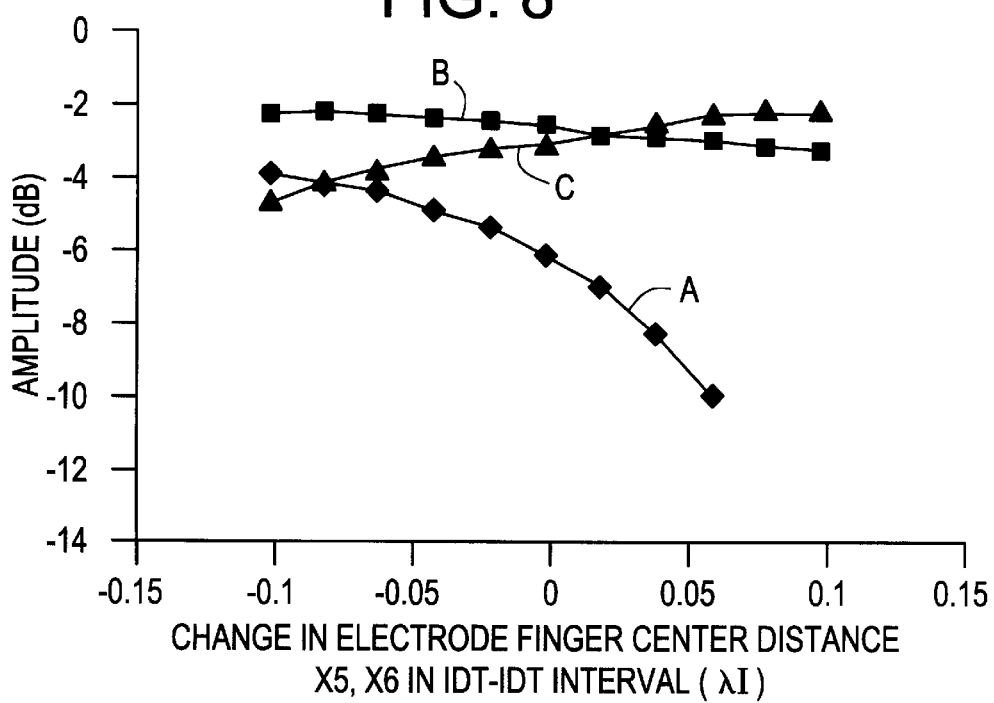
FIG. 8 is a graph showing changes in amplitude level between the three resonance modes obtained when the inter-center distances X5 and X6 are varied in the longitudinally coupled resonator type surface acoustic wave filter shown in FIG. 4.

FIGS. 5 and 6 show changes in the frequencies in the resonance modes A to C caused when the inter-center distances X1 and X4 shown in FIG. 4 are varied, FIGS. 7 and 8 show changes in the resonance mode frequencies, caused when the inter-center distances X5 and X6 (that is, the IDT-IDT intervals), and FIGS. 9 and 10 show changes in the resonance mode frequencies, caused when the inter-center distances X2 and X3 are varied.

In FIGS. 5 to 10, it is seen that the change-states of the frequencies in three kinds of the resonance modes, caused when the inter-center distances are varied, respectively, are different from each other, depending on the inter-center distances. Moreover, for the purpose of illustrating the differences in change of the characteristics caused when the respective inter-center distances are varied, FIGS. 11 to 13 show changes in the frequency characteristics, caused when the inter-center distances are changed by ±0.02 λI 1 in the above-described reference example.

Figure 12:
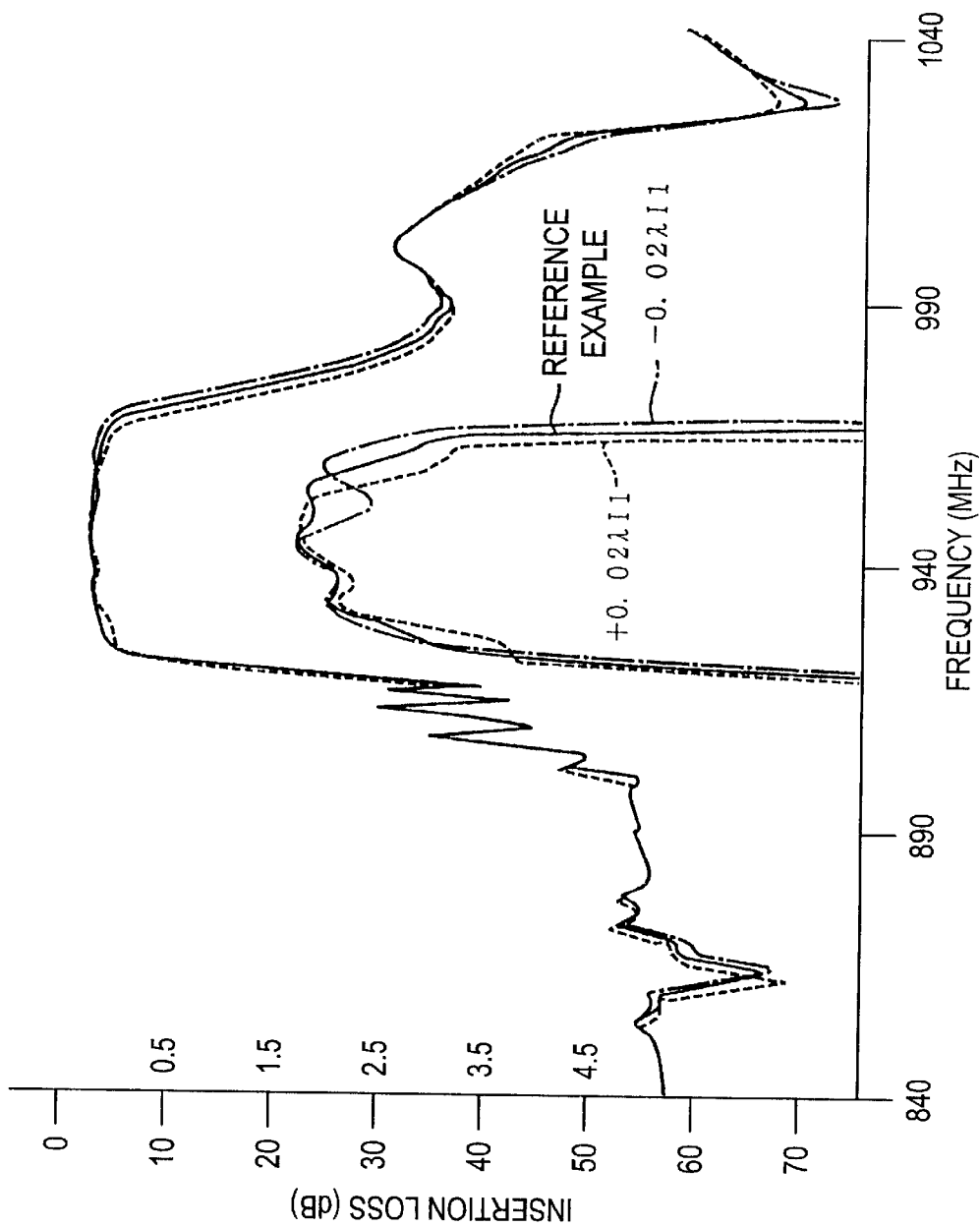
FIG. 12 is a graph showing changes in frequency characteristic obtained when the inter-center distances X5 and X6 are varied from the basic design values in the longitudinally coupled resonator type surface acoustic wave filter shown in FIG. 4.
Figure 13:
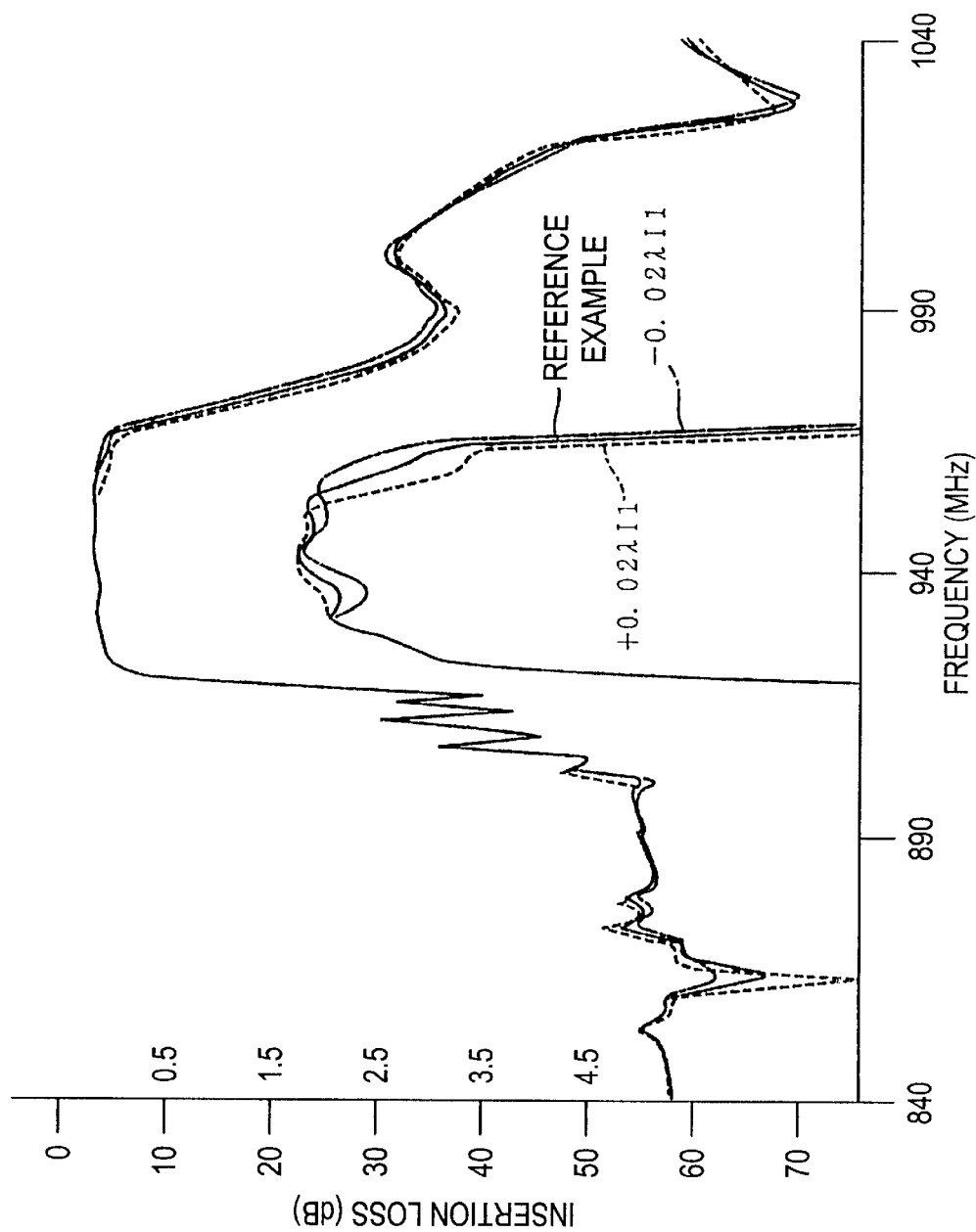
FIG. 13 is a graph showing changes in frequency characteristic obtained when the inter-center distances X2 and X3 are varied from the basic design values in the longitudinally coupled resonator type surface acoustic wave filter shown in FIG. 4.

FIG. 11 shows the results obtained when the inter-center distances X1 and X4 are changed, FIG. 12 shows those obtained when the inter-center distances X5 and X6 are changed, and FIG. 13 shows those obtained when the inter-center distances X2 and X3 are changed.

As seen in FIGS. 11 to 13, the changes within the pass band differ significantly when the respective inter-center distances are adjusted. That is, the inter-center distances X1 to X6, namely, the inter-center distances X1 and X4, the inter-center distances X5 and X6, and the inter-center distances X2 and X3 are paired, respectively. Thus, the flexibility for controlling the resonance mode frequencies and the levels by adjustment of three types of the inter-center distances is significantly enhanced.

In this preferred embodiment, the inter-center distances X1 to X4 are set to be greater than those of the above-described basic design value, while the inter-center distances X5 and X6 are set to be less than those of the basic design value. Thereby, the arrangement of the frequencies in the three resonance modes A to C is adjusted such that deviations in insertion loss and the VSWR within the pass band are greatly improved without changing the pass band-width.

Hereinafter, a modification of the first example will be described, in which the pass band is widened by adjusting the above-described three types of the inter-center distances. In this modification, the designs of the electrodes are changed as compared with the basic designs as follows:

electrode finger crossing width: 46.4 λI1 wavelength λI1 of IDT: 4.20 μm wavelength λIR of reflector: 4.30 μm inter-center distance X1 and X4: 0.25 λI1+0.25 λI2−0.010 λI1 inter-center distance X5 and X6: 0.50 λI2−0.020 λI1 inter-center distance X2 and X3: 0.25 λI1+0.25 λI2−0.015 λI1.

To achieve impedance-matching, the electrode finger crossing width W is changed. Moreover, the wavelength of the IDT and the wavelength of the reflectors are changed to correct deviations in center frequency.

Figure 14:
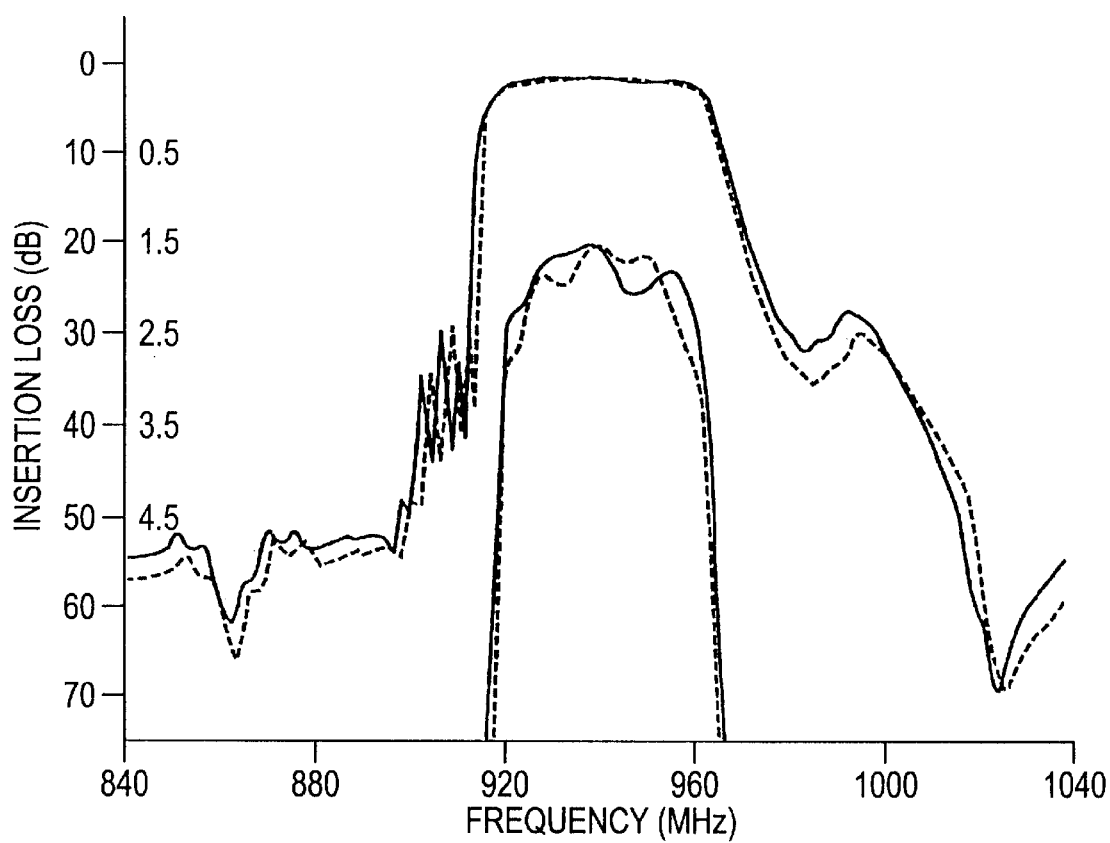
FIG. 14 is a graph showing the frequency characteristic of a modification of the first preferred embodiment.
Figure 15:
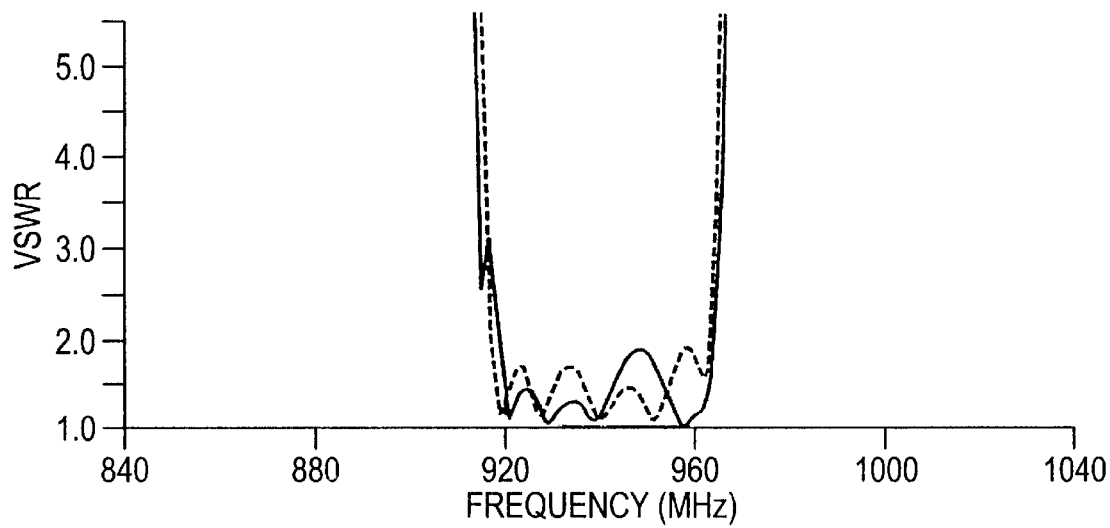
FIG. 15 is a graph showing the VSWR of the modification of the first preferred embodiment.

FIGS. 14 and 15 show the frequency characteristic and the VSWR of this modification.

In FIGS. 14 and 15, the solid lines represent the results of this modification, while the broken lines represent those of the reference example.

As seen in FIGS. 14 and 15, the pass bandwidth which corresponds to the range of from the through-level to the attenuation 4 dB lower than the through-level is increased by about 1 MHz as compared with the reference example. In this case, no significant deterioration is not shown as compared with the reference example, though some wave-shape is formed in the pass band, and the VSWR is comparable to that of the reference example.

Figure 16:
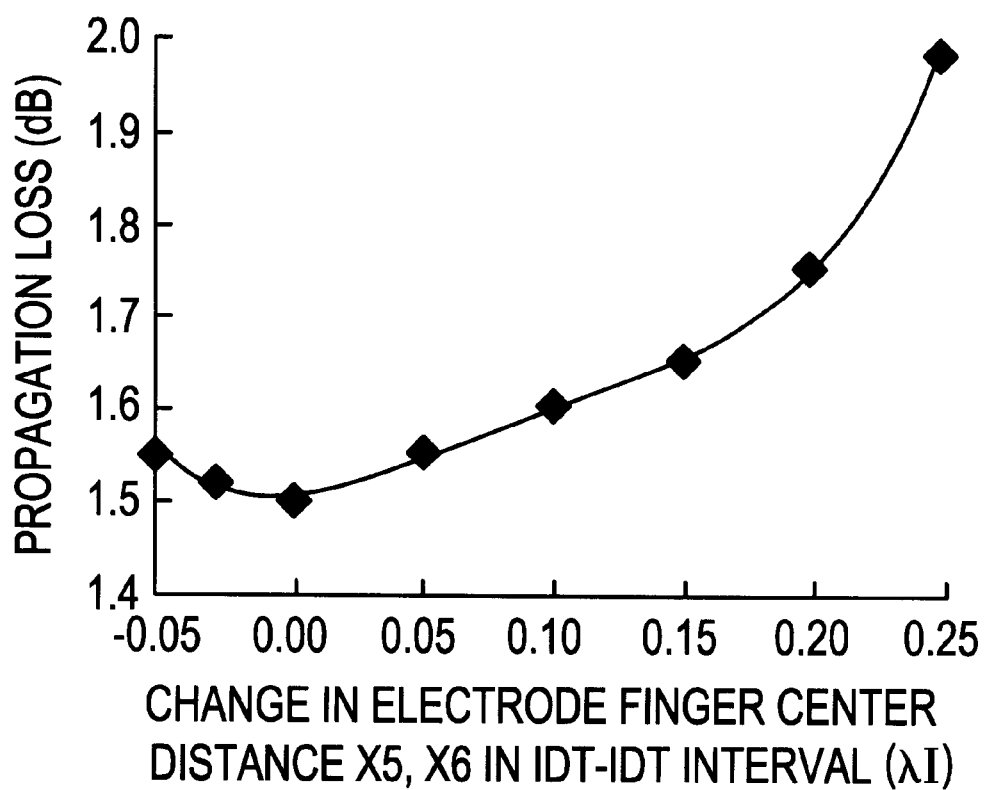
FIG. 16 is a graph showing the propagation loss of a surface acoustic wave obtained when the gaps between the IDT's are varied.

As described above, in the area in which a narrow pitch electrode finger portion is adjacent to the remaining electrode finger portion, and moreover, in the area in which IDT's are adjacent to each other, the inter-center distance between the centers of the adjacent two electrode fingers is changed from the value equal to the sum of 0.5 times each of the wavelengths determined by the pitches of the respective electrode fingers. However, this has the problem that the continuity of the propagation degree of a surface acoustic wave is deteriorated. FIG. 16 shows changes in propagation loss when the inter-center distances X5 and X6 shown in FIG. 1 are varied. Changes in IDT-IDT interval, that is, changes in inter-center distances X5 and X6 are plotted as abscissa. At the zero point, the inter-center distance is 0.5 λI2. The propagation loss is 0.5 λI2. Values obtained by removing a loss due to impedance mismatching from the insertion loss are plotted as ordinate.

In FIG. 16, it is seen that the propagation loss deteriorates which is caused when the inter-center intervals X5 and X6, that is, the IDT-IDT intervals are varied from zero.

It is presumed that the deviation in periodicity becomes the same as that of the conventional example by setting the inter-center distances X5 and X6 to be greater by about 0.25 λI1 than the basic design value, and thus, the propagation loss deteriorates until it becomes equal to that of the conventional example.

Similarly, when the other inter-center distances X1 to X4 shown in FIG. 1 are varied, the above-described deterioration of the propagation loss occurs. Accordingly, it is understood that preferably, the upper limit of the adjustment amount of the inter-center distances X1 to X6 is less that the value which is obtained by adding 0.25 λI1 (in which λI is the wavelength determined by the electrode finger pitch in an electrode finger portion, not in a narrow pitch electrode finger portion) to the basic design value, that is, the sum of 0.25 times each of the wavelengths determined by the respective pitches of the adjacent two electrode fingers. In the EGSM reception filter of the first preferred embodiment, the adjustment amount is about 0.25 λI1. The lower limit of the adjustment amount is set to be in the range in which etching process or lift-off process is available.

As described above, in the longitudinally coupled resonator type surface acoustic wave filters of the first example and the above-described modification, the design flexibilities for controlling dispersions in pass bandwidth and insertion loss, and the VSWR in the pass-band are significantly enhanced.

Moreover, similarly to the first preferred embodiment, the arrangement of the three resonance modes are controlled by adjusting the three types of the electrode finger inter-center distances, and thereby, the steepness of the filter characteristic in the vicinity of the pass band.

In the above preferred embodiments, a 40±5° Y cut X propagation LiTaO$_3$ substrate is used. However, the piezoelectric material defining the piezoelectric substrate in this invention has no special limitation. A 64 to 72° Y cut X propagation LiNbO$_3$ substrate, a 41° Y cut X propagation LiNbO$_3$ substrate, or other suitable substrate may be employed.

Figure 17A:
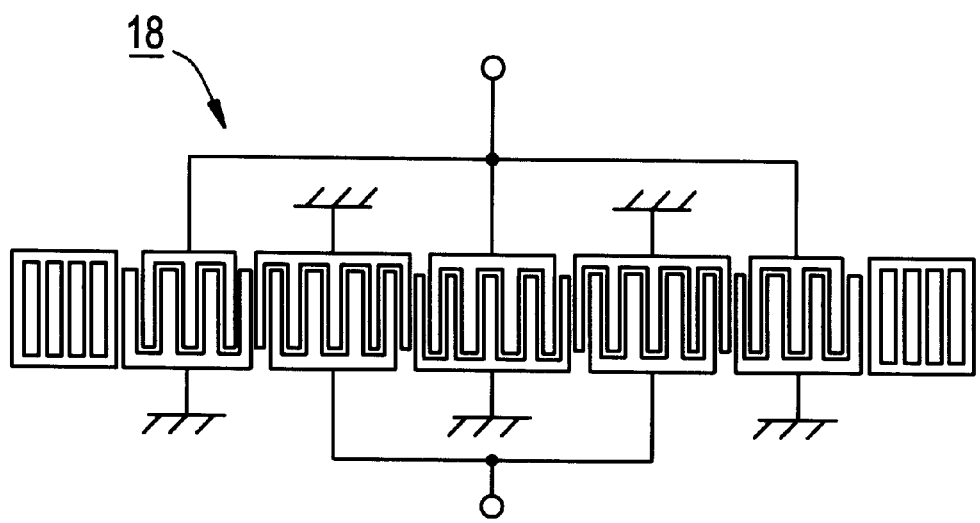
FIGS. 17A and 17B are schematic plan views of the modification of the first preferred embodiment.
Figure 17B:
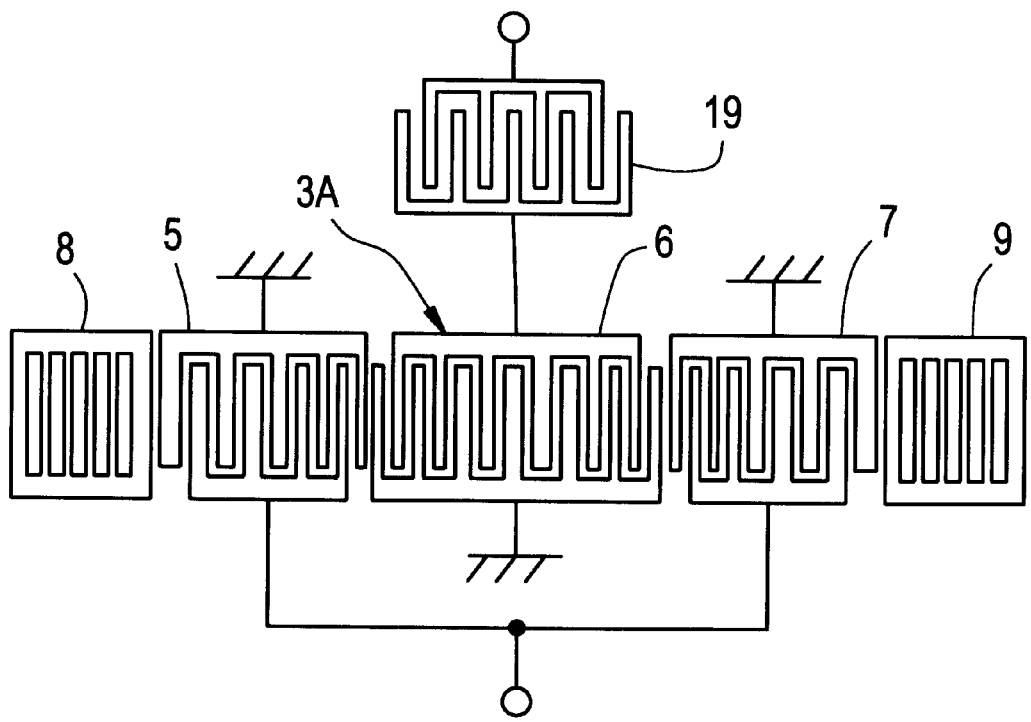

Moreover, in the above-described preferred embodiments, three IDT type longitudinally coupled resonator type surface acoustic wave filter portions each having first, second, and third IDT's are two-stage dependently connected, and the 1-stage 3 IDT type longitudinally coupled resonator type surface acoustic wave filter portion 3A are described. The present invention can also be applied to a five IDT type longitudinally coupled resonator type surface acoustic wave filter 18 having five IDT's as shown in FIG. 17A, and a multi-electrode longitudinally coupled resonator type surface acoustic wave filter having more than 5 IDT's. Furthermore, the present invention can be applied to a device in which a surface acoustic wave resonator 19 is connected in series with a surface acoustic wave filter portion 3A as shown in FIG. 17B.

Figure 18:
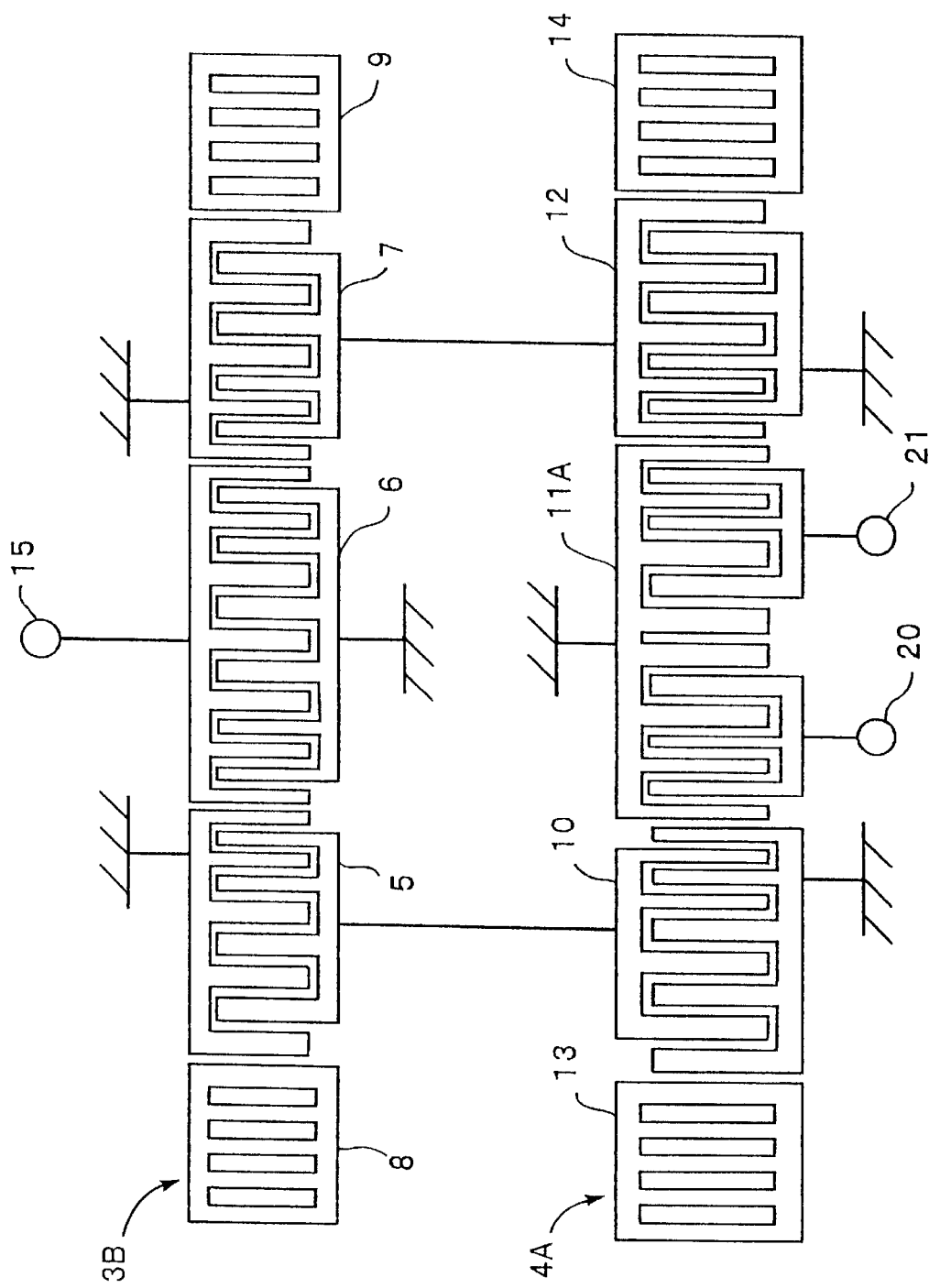
FIG. 18 is a schematic plan view of another modification of the first preferred embodiment.

Moreover, as shown in FIG. 18, one of the interdigital electrodes of the IDT 11A in the center of the second longitudinally coupled resonator type surface acoustic wave filter portion 4A may be divided into two portions, and output terminals 20 and 21 are connected to the portions, respectively. Thus, a longitudinally coupled resonator type surface acoustic wave filter having a balance—unbalance conversion function may be produced as in this example.

In addition, when the two-stage dependent connection is carried out, the first longitudinally coupled resonator type surface acoustic wave filter portion 3B and the second longitudinally coupled resonator type surface acoustic wave filter portion 4A may have different electrode finger crossing widths. Furthermore, the longitudinally coupled resonator type surface acoustic wave filter portions of the respective stages may have different design conditions other than the electrode finger crossing width.

Furthermore, in the first preferred embodiment, both of the adjacent electrode fingers provided in neighboring IDT's are connected to the ground potential. One of the electrode fingers may be a ground electrode, and the other electrode finger may be a signal electrode, as seen in the surface acoustic wave filter portion 3B of FIG. 18.

In the first preferred embodiment, the arrangement of the three resonance modes are controlled by adjustment of the three types of the electrode finger inter-center distances, that is, the electrode finger inter-center distances X1 and X4, the electrode finger inter-center distances X5 and X6, and the electrode finger inter-center distances X2 and X3. However, as described above, when the distance between the centers of the two adjacent electrode fingers in a narrow pitch electrode finger portion and the neighboring electrode finger portion, or the distance between the centers of the adjacent electrode fingers provided in neighboring IDT's are varied from the sum obtained by addition of the values of 0.25 times each of the wavelengths determined by the electrode finger pitches, the continuity of a surface acoustic wave is damaged as described above. Such a change amount as employed in the first preferred embodiment does not significantly influence the continuity of the surface acoustic wave. The loss may considerably increase with the above-described IDT-IDT intervals.

Figure 19:
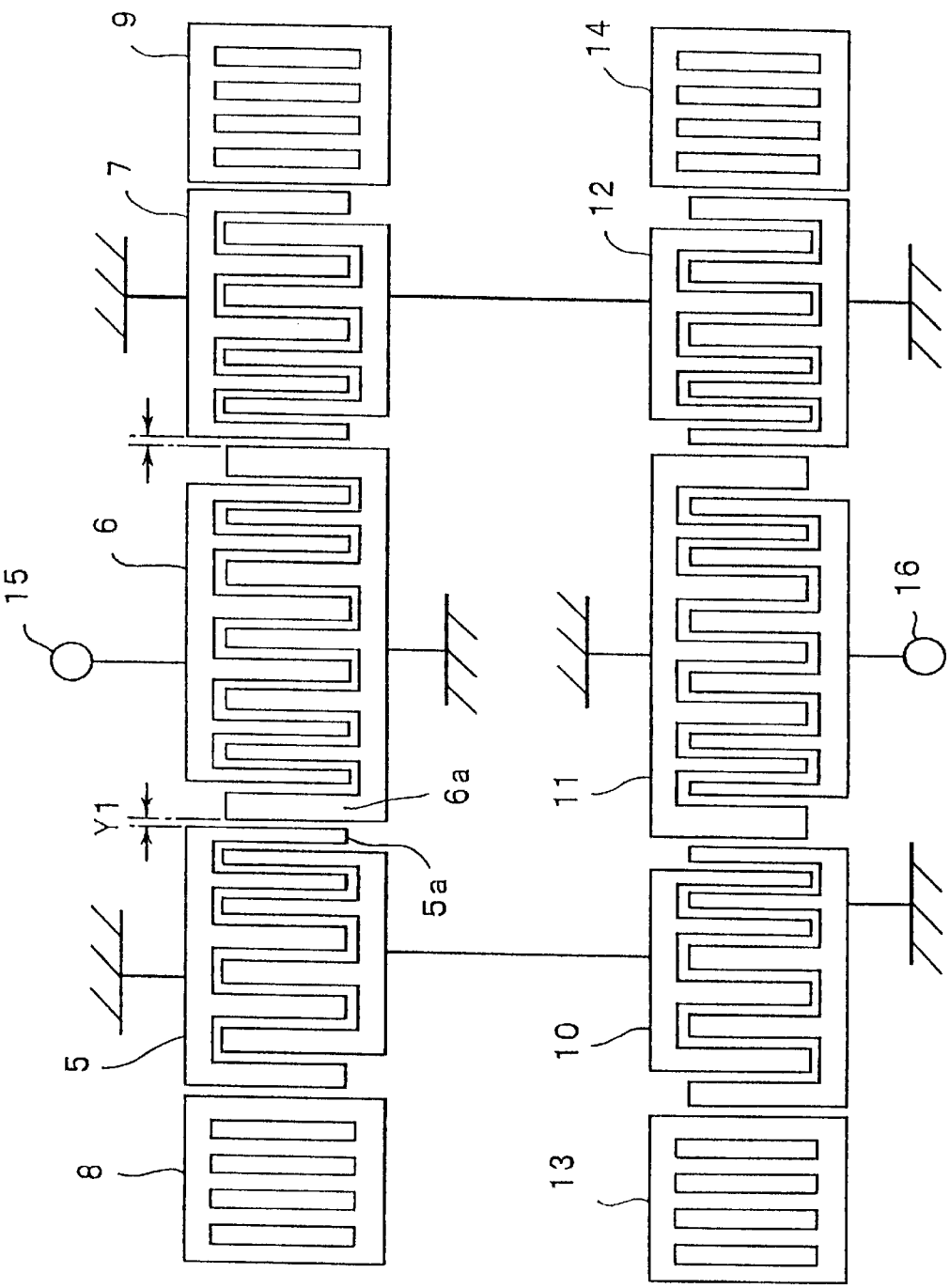
FIG. 19 is a schematic plan view according to a second preferred embodiment.
Figure 20:
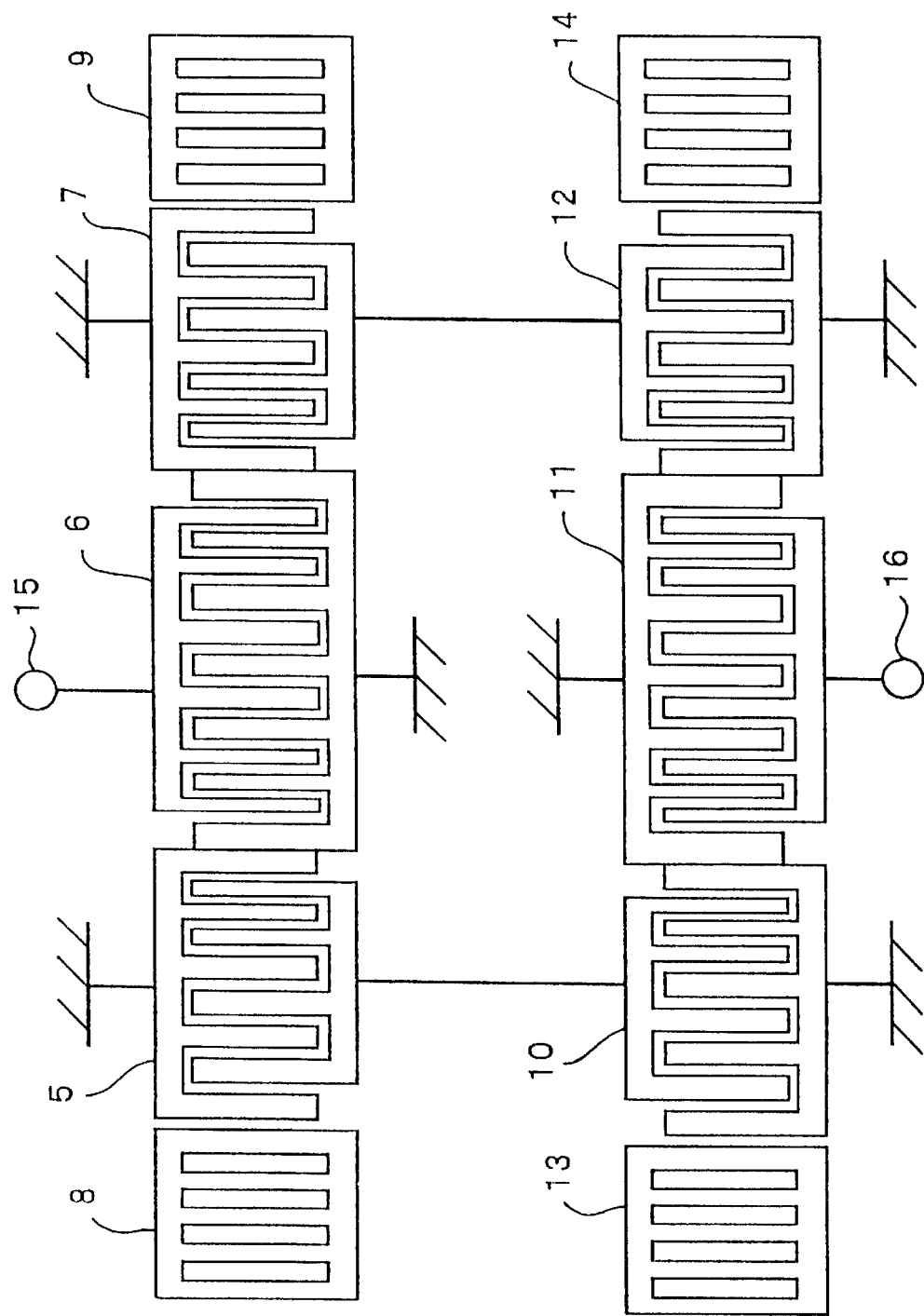
FIG. 20 is a schematic plan view for illustration of a longitudinally coupled resonator type surface acoustic wave filter according to a modification of the second preferred embodiment.

In the second preferred embodiment, to solve the above-described problem, as shown in FIG. 19, the electrode finger inter-center distances X5 and X6 between the IDT's 5 and 6, between the IDT's 6 and 7, between the IDT's 10 and 11, and between the IDT's 11 and 12 are increased, and one of adjacent electrodes is configured to have an increased thickness. For example, in the adjacent electrode fingers 5a and 6a of the IDT's 5 and 6, the thickness of one electrode finger 6a is increased, and thereby, the gap Y1 between the electrode fingers 5a and 6a is equal to the gap between the electrode fingers in the narrow pitch electrode portion in the vicinity of the gap Y1. As described above, in the case in which the IDT-IDT interval is increased as compared with that of the above reference example, and the enlarged area between the IDT's is produced, the insertion loss in the pass band deteriorates. However, as in the second preferred embodiment, one of the adjacent electrode fingers is configured to have an increased thickness, and thus the gap between the electrode fingers is substantially equal to the gap between the electrode fingers in the vicinity thereof. Thereby, the deterioration of the insertion loss is greatly reduced. FIG. 20 is a schematic plan view of a longitudinally coupled resonator type surface acoustic wave filter according to a modification of the second preferred embodiment. In the second preferred embodiment, one of the adjacent electrode fingers is configured to have an increased thickness. In the modification shown in FIG. 20, the IDT-IDT interval area is completely metallized. That is, the area between the neighboring IDT's is completely metallized. Also in this case, similarly to the second preferred embodiment, the deterioration of the insertion loss in the pass band is greatly suppressed. This will be described with reference to concrete experimental examples.

The following Table 1 lists the values of propagation loss obtained when the electrode finger inter-center distances X5 and X6 are increased from 0.5λI2 by 0.2 λI1, that is, Table 1 lists the values of the propagation loss in first preferred embodiment and the modification of FIG. 20. Here, the propagation loss means a value obtained by subtracting a loss caused by impedance mismatching from the insertion loss. For reference, propagation losses, obtained when the IDT-IDT intervals, that is, the electrode finger inter-center distances X5 and X6 are 0.5 λI2 (that is, the above-described reference example), are also listed.

Table 1

|  |  | propagation loss (dB) |
|---|---|---|
| first embodiment | IDT-IDT interval free | 1.75 |
| modification of FIG. 20 | IDT-IDT interval metallized | 1.50 |
| reference example | IDT-IDT interval 0.50λI2 | 1.50 |

As seen in Table 1, in the modification of FIG. 20, the propagation loss is restored to the same value obtained when the electrode finger inter-center distances X5 and X6, which are IDT-IDT intervals, are 0.5 λI2.

That is, when the positions of the resonance modes are controlled by increasing the IDT-IDT intervals, the deterioration of the insertion loss is greatly suppressed by metallizing the IDT-IDT interval areas.

In the first preferred embodiment, the upper limit of the adjustment amount of the electrode finger inter-center distances X5 and X6, that is, the IDT-IDT intervals, is set to the value obtained by adding 0.25 λI to the sum of 0.25 λI times each of the two adjacent electrode finger pitches. However, the adjustment amount may be further increased, when the constitution of the second example is used.

Moreover, it is understood that when each of the IDT-IDT intervals is increased, similar advantages are obtained by configuring one of the adjacent electrode fingers to have a reduced thickness (second example) and setting the gap between the adjacent electrode fingers to be substantially equal to the gap between the electrode fingers in the vicinity thereof.

Figure 21:
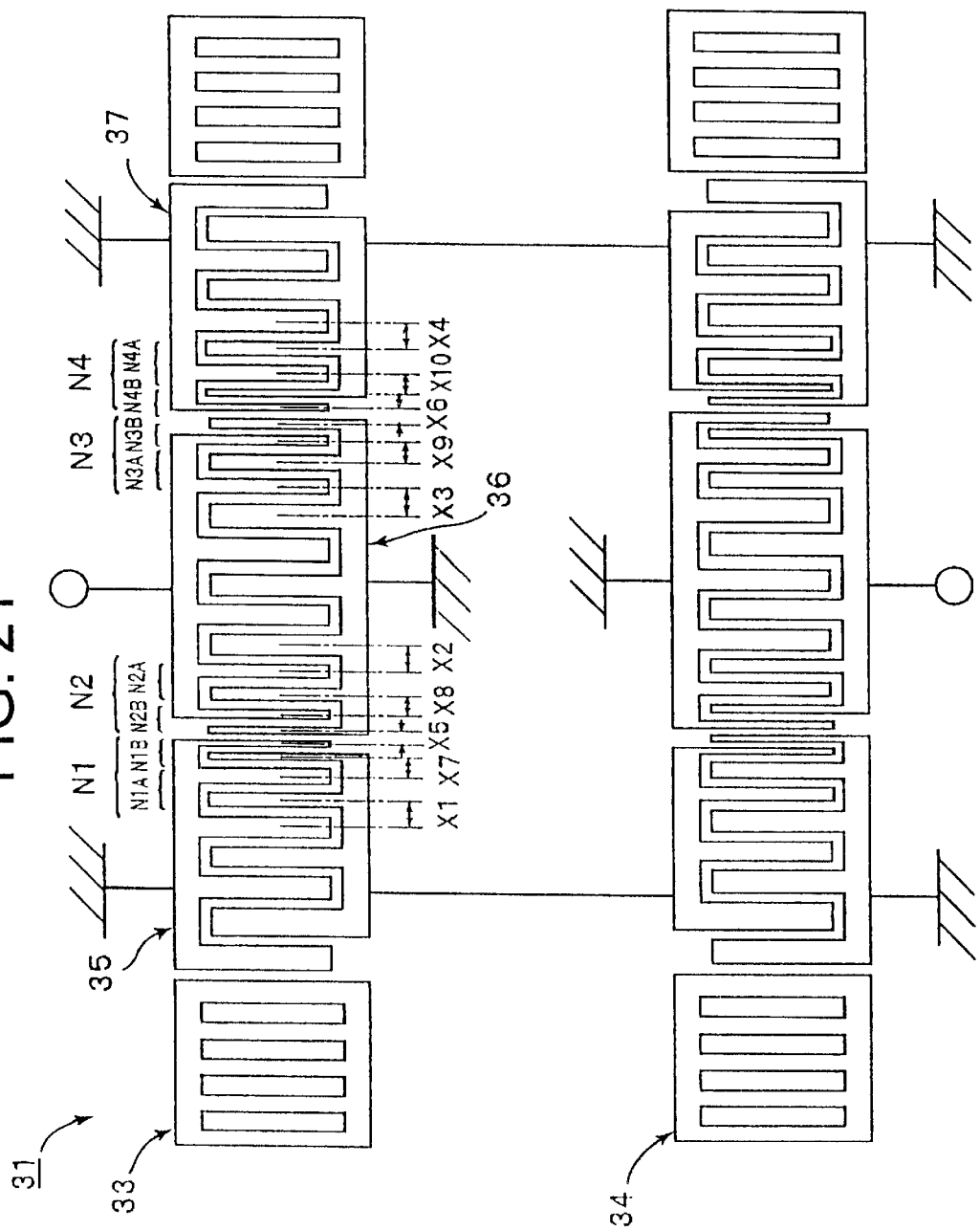
FIG. 21 is a schematic plan view for illustration of a longitudinally coupled resonator type surface acoustic wave filter according to a third preferred embodiment.

FIG. 21 is a schematic plan view of a longitudinally coupled resonator type surface acoustic wave filter according to a third preferred embodiment. In a longitudinally coupled resonator type surface acoustic wave filter 31 of the third preferred embodiment, two electrode finger pitches are provided in the narrow pitch electrode finger portion. In other respects, the filter 31 is substantially the same as the longitudinally coupled resonator type surface acoustic wave filter of the first preferred embodiment. Accordingly, the same components are designated by the same reference numerals, and for these component, the description in the first example is applied.

Surface acoustic wave filter portions 33 and 34 are two-stage dependently connected in the similar manner to that of the first preferred embodiment. In the surface acoustic wave filter portion 33, IDT's 35 to 37 are arranged in the surface acoustic wave propagation direction. The IDT's 35 to 37 each have a narrow pitch electrode finger portion similar to the IDT's 5 to 7. In the IDT 33, the narrow pitch electrode finger portion N1 includes electrode finger portions N1A and N1B having different electrode finger pitches. That is, the electrode finger portion N1B including two electrode fingers provided in the end of the IDT 35 near the IDT 36, and the succeeding electrode finger portion N1A have different electrode finger pitches. Similarly, in the narrow pitch electrode finger portions N2 and N3 of the IDT 6, electrode finger portions N2A, N2B, N3A, and N3b having different electrode finger pitches are provided. Moreover, similarly, in the IDT 37, the narrow pitch electrode finger portions N4A and N4B have different electrode finger pitches.

Also, the longitudinally coupled resonator type surface acoustic wave filter portion 34 is similarly configured. In the respective IDT's, the electrode finger portions N1B, N2B, N3B, and N4B, which are positioned relatively close to the neighboring ends of IDT's are classified into a group B. The narrow pitch electrode finger portions N1A, N2A, N3A, and N4A, which are positioned relatively far from the neighboring ends of IDT's are classified into a group A. All of the electrode finger pitches of the group A are the same, and all of the electrode finger pitches of the group B are the same.

To enhance the continuity of the propagation path of a surface acoustic wave, the electrode finger pitch of the group A is set to be greater than that of the group B.

Accordingly, in the longitudinally coupled resonator type surface acoustic wave filter portion 33, as the area in which electrode fingers having different electrode finger pitches are adjacent to each other, the area in which a pair of the adjacent electrode fingers are adjacent to each other in the electrode finger portions having different electrode finger pitches of the respective narrow pitch electrode finger portions is produced, in addition to the area in which a pair of electrode fingers are adjacent to each other at each of the inter-center distances X1 to X6. That is, the areas indicated by the arrows X7 to X10 are shown in FIG. 21. In this preferred embodiment, each of the inter-center distances X1 to X10 is set at the value equal to the sum of 0.25 times the wavelength determined by the pitch of a pair of the neighboring electrode fingers. The other detail designs are as follows. The longitudinally coupled resonator type surface acoustic wave filter portion 34 is designed in the same manner as the longitudinally coupled resonator type surface acoustic wave filter portion 33.

The electrode finger crossing width is 40.5 λI1.

The wavelength λI1 of the IDT in each of the electrode finger portions excluding the narrow pitch electrode finger portions is 4.20 μm.

The wavelength λI2 of the electrode fingers of the group A is 3.92 μm.

The wavelength λI3 of the electrode fingers of the group B is 3.87 μm.

The wavelength λR of the respective reflectors is 4.30 μm.

Figure 22:
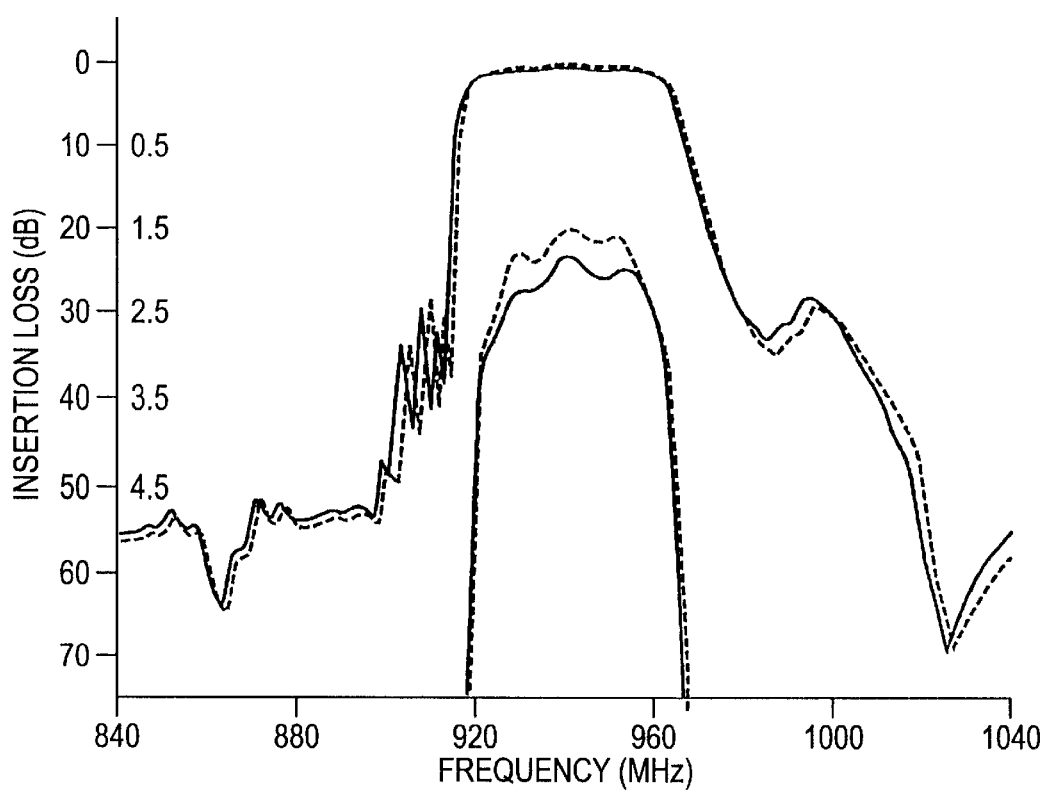
FIG. 22 is a graph showing the frequency characteristic of the longitudinally coupled resonator type surface acoustic wave filter of the third preferred embodiment.
Figure 23:
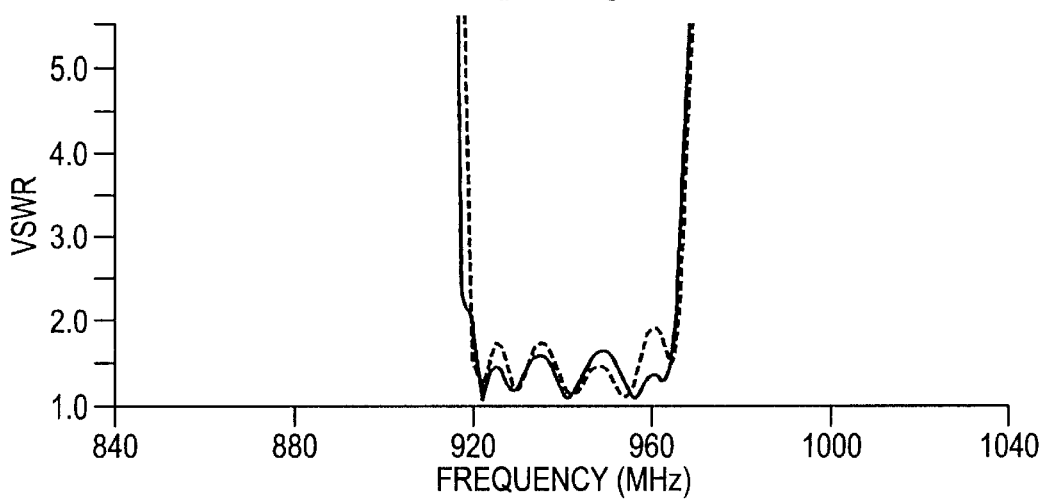
FIG. 23 is a graph showing the VSWR's of the longitudinally coupled resonator type surface acoustic wave filters of the third preferred embodiment and the reference example.

FIGS. 22 and 23 show the frequency characteristic and the VSWR of the longitudinally coupled resonator type surface acoustic wave filter of the third preferred embodiment. The characteristics of the reference example previously described in the first preferred embodiment are represented by the broken lines.

As seen in FIGS. 22 and 23, according to the third preferred embodiment, the VSWR is improved by about 0.25, and the minimum insertion loss is substantially increased, as compared with the above-described reference example. Thus, dispersions in insertion loss within the pass band are greatly reduced.

In this case, the pass bandwidth which corresponds to the range of from the through-level to the attenuation 4 dB lower than the through-level is similar to that of the reference example.

That is, the arrangement of the three resonance modes A, B, and C is controlled in a similar fashion to the first preferred embodiment by adjusting each of the narrow pitch electrode finger portions to have two electrode finger portions of which the pitches are different, such that the characteristics are greatly improved. In the third preferred embodiment, the two electrode finger portions having different electrode finger pitches are arranged in each of the narrow pitch electrode finger portions. At least three electrode finger portions having different pitches may be arranged.

Furthermore, the arrangement of the above-described three resonance modes is controlled by adjusting the inter-center distances X1 to X10 shown in FIG. 21. In the third preferred embodiment, the flexibility of controlling the arrangement of the three resonance modes is further improved as compared with the first preferred embodiment.

Figure 24:
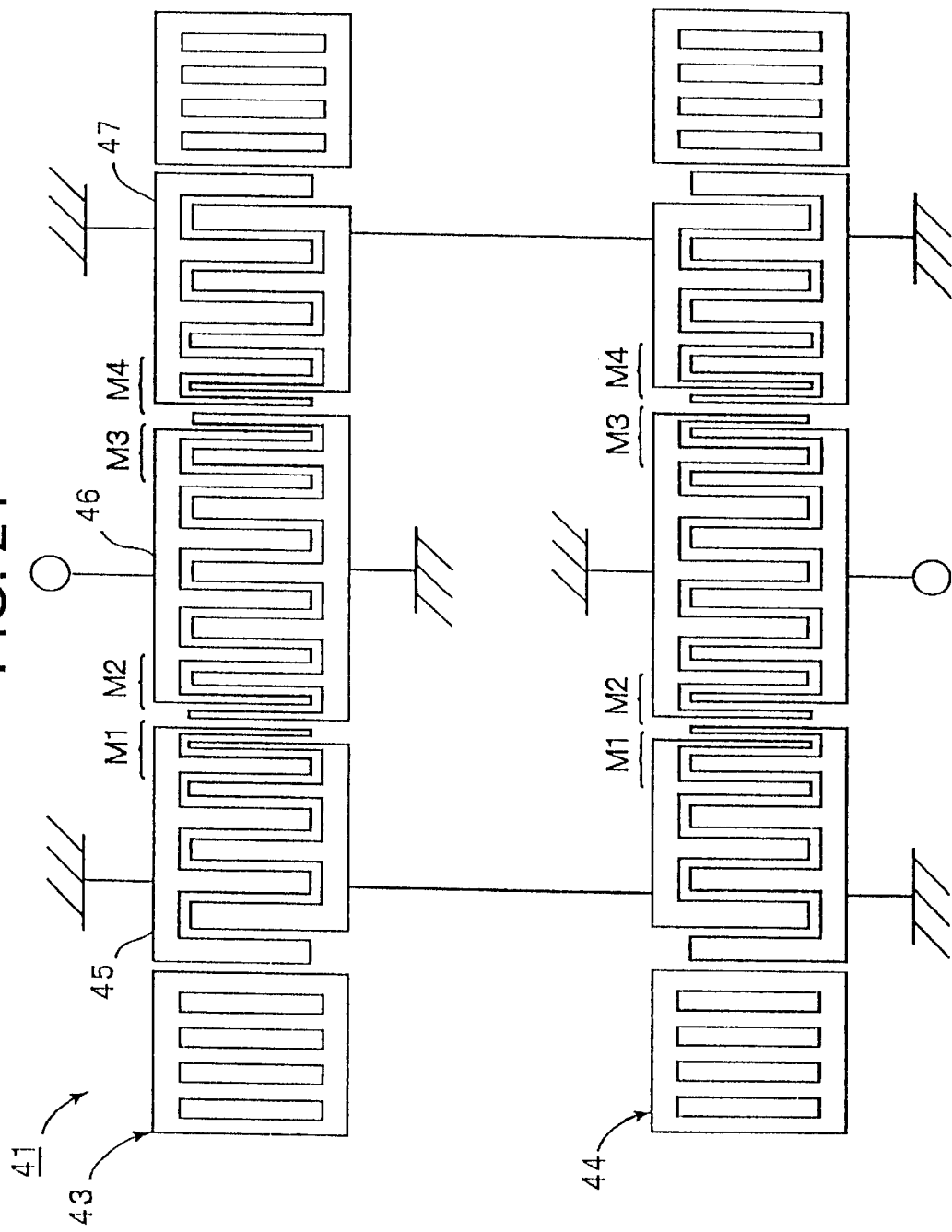
FIG. 24 is a schematic plan view of a longitudinally coupled resonator type surface acoustic wave filter according to a fourth preferred embodiment.

FIG. 24 is a schematic plan view of a longitudinally coupled resonator type surface acoustic wave filter according to a fourth preferred embodiment. In the longitudinally coupled resonator type surface acoustic wave filter 41 of the fourth preferred embodiment, longitudinally coupled resonator type surface acoustic wave filter portions 43 and 44 are two-stage dependently connected, similar to the longitudinally coupled resonator type surface acoustic wave filter portions 3 and 4 of the first preferred embodiment. In the longitudinally coupled resonator type surface acoustic wave filter 43, in the area where IDT's 45 and 46 are adjacent to each other, a portion of the electrode finger portion of the IDT 45 which is near the end thereof on the IDT 46 side, is configured as a chirp type electrode finger portion M1. More particularly, the pitches of the four electrode fingers of the IDT 45 in the area near the end thereof on the IDT 46 side, including the electrode finger on the end thereof are linearly changed. That is, as the electrode fingers are positioned farther from the end of the IDT 46, the pitches are increased. Thus, the chirp type electrode finger portion M1 is provided instead of the narrow pitch electrode finger portion in the first preferred embodiment. Similarly, in the IDT's 46 and 47, chirp type electrode finger portions M2 to M4 are provided instead of the narrow pitch electrode finger portions, in the area where IDT's are adjacent to each other.

To enhance the continuity of the propagation path of a surface acoustic wave, the electrode finger pitches are arranged in decreasing order from the center of the IDT 45 toward the end thereof on the IDT 46 side. The longitudinally coupled resonator type surface acoustic wave filter portion 44 is also configured similar to the longitudinally coupled resonator type surface acoustic wave filter portion 43.

The same advantages as those of the first preferred embodiment are obtained by providing a chirp type electrode finger portion instead of the narrow pitch electrode finger portion in this preferred embodiment. That is, the arrangement of the above-described three resonance modes is controlled similarly to the first preferred embodiment, by adjusting the values of the maximum and minimum pitches or the difference between them in the chirp type electrode finger portion.

Figure 25:
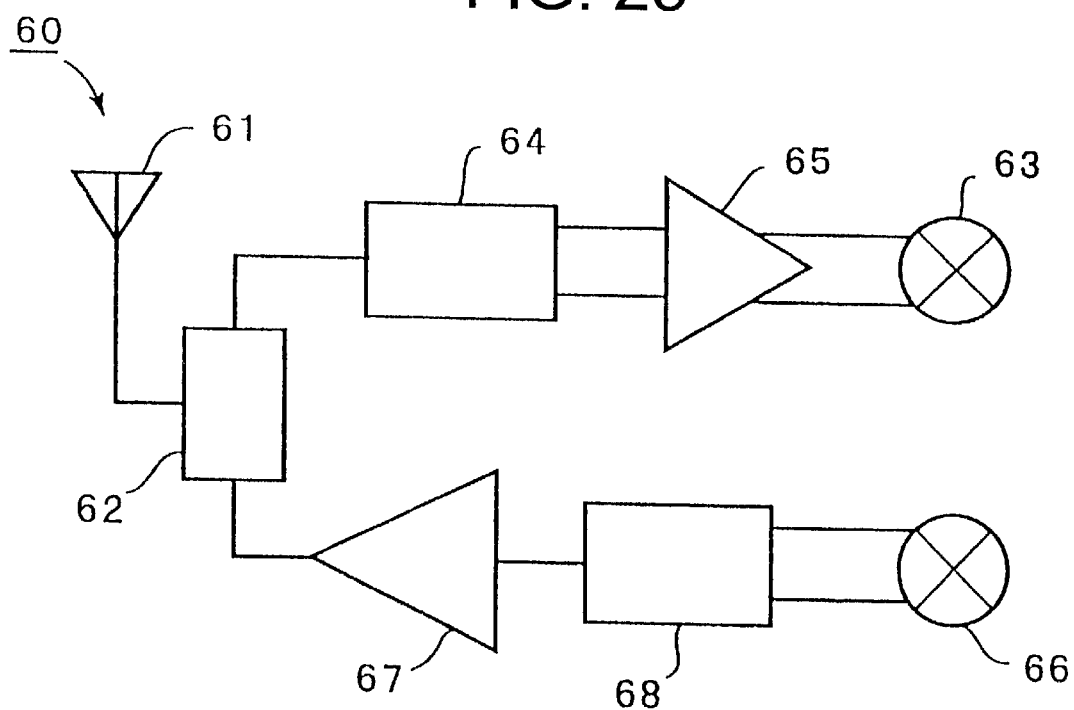
FIG. 25 is a schematic block diagram showing an example of a communication device formed, using the longitudinally coupled resonator type surface acoustic wave filter of the present invention.
Figure 26:
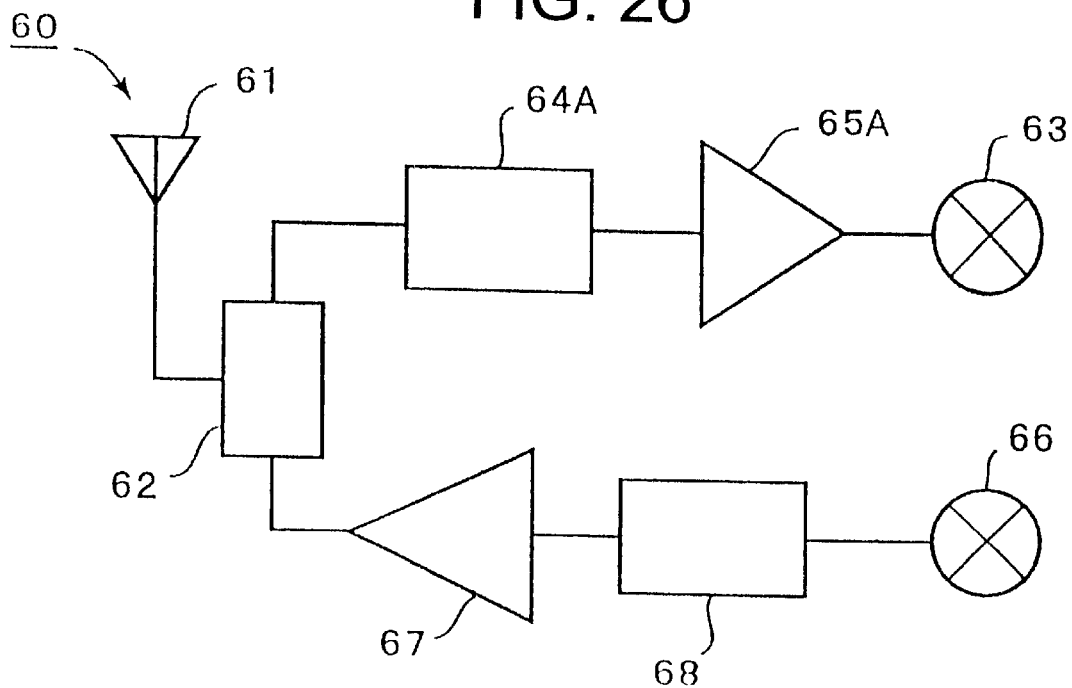
FIG. 26 is a schematic block diagram showing another example of a communication device formed, using the longitudinally coupled resonator type surface acoustic wave filter of the present invention.

FIGS. 25 and 26 are schematic block diagrams illustrating a communication device using the longitudinally coupled resonator type surface acoustic wave filter of the present invention.

In FIG. 25, a diplexer 62 is connected to an antenna 61. A longitudinally coupled resonator type surface acoustic wave filter 64 configured according to the present invention and an amplifier 65 are connected between the diplexer 62 and a reception side mixer 63. Moreover, an amplifier 67 and a longitudinally coupled resonator type surface acoustic wave filter 68 configured according to the present invention are connected between the diplexer 62 and a transmission side mixer 66. In the case in which the amplifier corresponds to a balanced signal as described above, the longitudinally coupled resonator type surface acoustic wave filter configured according to the present invention is effectively used as the surface acoustic wave filter 64.

Moreover, in the case in which the amplifier 65A used on the reception side corresponds to an unbalanced signal as shown in FIG. 26, a longitudinally coupled resonator type surface acoustic wave filter configured according to the present invention is effectively used as the surface acoustic wave filter 64.

In this communication device, a wide band, enhancement of the insertion loss within the pass band, and improvement of the VSWR are achieved.

According to an longitudinally coupled resonator type surface acoustic wave filter of the present invention, at least one of the first, second, and third IDT's containing at least one narrow pitch electrode finger portion in which the pitches of a portion of the electrode fingers arranged from the end of the IDT on the neighboring IDT side are less than the other portion of the electrode fingers, wherein the distance between the centers of at least one pair of adjacent electrode fingers is deviated from 0.25 $\lambda A$+0.25 $\lambda B$ in which $\lambda A$ represents the wavelength determined by the pitch of one electrode finger, and $\lambda B$ represents the wavelength determined by the pitch of the other electrode finger. Thus, the arrangement of the above-described three resonance modes is controlled by adjusting the inter-center distances, and thereby, a wide band, enhancement of the flatness of the insertion loss within the pass band, and improvement of the VSWR are achieved.

If $\lambda I2$ represents the wavelength determined by the electrode finger pitch of the narrow pitch electrode finger portion, and $\lambda I1$ represents the pitch of the electrode finger portion provided in the IDT containing the narrow pitch electrode finger portion and being other than the narrow pitch electrode finger portion, the distance between the centers of the adjacent electrode fingers of the neighboring IDT's being deviated from 0.5 $\lambda I2$, when the narrow pitch electrode finger portions are arranged on both of the neighboring sides of the IDT's, and moreover, being set to be different from 0.25 $\lambda I1$+0.25 $\lambda I2$, when the narrow pitch electrode finger portion is provided in only one of the IDT's. In this case, similarly, the arrangement of the above-described three resonance modes is significantly controlled by adjusting the inter-center distances. Thereby, a wide band, enhancement of the flatness of the insertion loss within the pass band, and improvement of the VSWR is achieved.

In the case in which the distance between the centers of the adjacent electrode fingers provided in the narrow pitch electrode finger portion and the electrode finger portion other than the narrow pitch electrode finger portion is deviated from 0.25 $\lambda I1$+0.25 $\lambda I2$, similarly, the arrangement of the above-described three resonance modes is significantly controlled by adjusting the inter-center distances, and thereby, a wide band, enhancement of the flatness of the insertion loss within the pass band, and improvement of the VSWR are achieved.

When the distance between the centers of the adjacent electrode fingers deviates as described above, the deviation amount is preferably up to about 0.25 $\lambda I1$. Thereby, deterioration of the propagation loss is greatly suppressed.

In the present invention, the electrode covering ratio of one electrode finger of a pair of the adjacent electrode fingers provided in the neighboring IDT's is relatively high, wherein the gap between a pair of the adjacent electrode fingers is substantially reduced. Thus, the continuity of the propagation path of a surface acoustic wave between IDT's is greatly enhanced, and deterioration of the insertion loss within the pass band is greatly suppressed.

Similarly, in the case in which an area between a pair of the adjacent electrode fingers provided in the neighboring IDT's is metallized, the continuity of the propagation path of a surface acoustic wave between IDT's is also enhanced, and deterioration of the insertion loss within the pass band is greatly suppressed.

Moreover, when an electrode finger portion having a different electrode finger pitch is provided in the narrow pitch electrode finger portion, the above-described arrangement of the three resonance modes is controlled by adjusting the distance between the centers of the adjacent electrode fingers in the neighboring electrode finger portions with different electrode finger pitches provided in the narrow pitch electrode finger portion. A wide band, enhancement of the flatness of the insertion loss within the pass band, and improvement of the VSWR are achieved.

Especially, in the case in which an electrode finger portion having a different electrode finger pitch is provided in the narrow pitch electrode finger portion, the distance between the centers of at least one pair of the adjacent electrode fingers provided in the narrow pitch electrode finger portions having different electrode finger pitches, respectively is deviated from 0.25 $\lambda A+0.25$ $\lambda B$, in which $\lambda A$ and $\lambda B$ represent the wavelengths determined by the respective electrode finger pitches. In this case, the arrangement of the three resonance modes is significantly controlled. Thus, a wide band, enhancement of the flatness of the insertion loss within the pass band, and improvement of the VSWR is achieved.

In the case in which the narrow pitch electrode finger portion includes a chirp type electrode finger portion, the arrangement of the above-described three resonance modes is significantly controlled by adjusting the maximum and minimum pitch values and the difference between them in the chirp type electrode finger portion.

Particularly, when the chirp type electrode finger portion is configured to have electrode finger pitches arranged in the linearly decreasing order from the center in the surface acoustic wave propagation direction of the IDT toward the outside thereof, the continuity of the propagation path of a surface acoustic wave is greatly enhanced, such that deterioration of the insertion loss is prevented.

While the present invention has been described with reference to what are at present considered to be preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A longitudinally coupled resonator type surface acoustic wave filter comprising:
   a piezoelectric substrate; and
   first, second, and third IDT's provided on the piezoelectric substrate to extend along the surface acoustic wave propagation direction and having plural electrode fingers, respectively;
   at least one of the first, second, and third IDT's including at least one narrow pitch electrode finger portion in which the pitches of a portion of the electrode fingers arranged from the end of the IDT on the neighboring IDT side are less than the remaining portions of the electrode fingers in the IDT;
   the distance between the centers of at least one pair of adjacent electrode fingers being deviated from 0.25 $\lambda A+0.25$ $\lambda B$ in which $\lambda A$ represents the wavelength determined by the pitch of one electrode finger of the at least one pair of adjacent electrode fingers, and $\lambda B$ represents the wavelength determined by the pitch of the other electrode finger of the at least one pair of adjacent electrode fingers.

2. A longitudinally coupled resonator type surface acoustic wave filter according to claim 1, wherein the deviation amount of the distance between the centers of the adjacent electrode fingers is up to 0.25 $\lambda A$.

3. A longitudinally coupled resonator type surface acoustic wave filter according to claim 1, wherein the electrode covering ratio of one electrode finger of a pair of the adjacent electrode fingers provided in the neighboring IDT's is relatively high, whereby the gap between a pair of the adjacent electrode fingers is reduced.

4. A longitudinally coupled resonator type surface acoustic wave filter according to claim 1, wherein an area between a pair of the adjacent electrode fingers provided in the neighboring IDT's is metallized.

5. A longitudinally coupled resonator type surface acoustic wave filter according to claim 1, wherein the narrow pitch electrode finger portion is a chirp type electrode finger portion.

6. A longitudinally coupled resonator type surface acoustic wave filter according to claim 5, wherein the chirp type electrode finger portion is configured so as to have electrode finger pitches arranged in the linearly decreasing order from the center in the surface acoustic wave propagation direction of the IDT toward the outside thereof.

7. A longitudinally coupled resonator type surface acoustic wave filter comprising plural longitudinally coupled resonator type surface acoustic wave filters of claim 1 plural-stage dependently connected.

8. A communication device comprising longitudinally coupled resonator type surface acoustic wave filters of claim 1.

9. A longitudinally coupled resonator type surface acoustic wave filter comprising:
   a piezoelectric substrate; and
   first, second, and third IDT's provided on the piezoelectric substrate to extend along the surface acoustic wave propagation direction and having plural electrode fingers, respectively;
   at least one of the first, second, and third IDT's including at least one narrow pitch electrode finger portion in which the pitches of a portion of the electrode fingers arranged from the end of the IDT on the neighboring IDT side are less than the remaining portions of the electrode fingers in the IDT; wherein
   $\lambda I2$ represents the wavelength determined by the electrode finger pitch in the narrow pitch electrode finger portion, and $\lambda I1$ represents the pitch in the electrode finger portion provided in the IDT containing the narrow pitch electrode finger portion and being other than the narrow pitch electrode finger portion;
   the distance between the centers of the adjacent electrode fingers of the neighboring IDT's being deviated from 0.5 $\lambda I2$, when the narrow pitch electrode finger portions are arranged on both of the neighboring sides of the IDT's, respectively, and set to be different from 0.25 $\lambda I1+0.25$ $\lambda I2$, when the narrow pitch electrode finger portion is provided in only one of the IDT's.

10. A longitudinally coupled resonator type surface acoustic wave filter according to claim 9, wherein the deviation amount of the distance between the centers of the adjacent electrode fingers is up to 0.25 $\lambda I1$.

11. A longitudinally coupled resonator type surface acoustic wave filter according to claim 9, wherein the electrode covering ratio of one electrode finger of a pair of the adjacent electrode fingers provided in the neighboring IDT's is relatively high, whereby the gap between a pair of the adjacent electrode fingers is reduced.

12. A longitudinally coupled resonator type surface acoustic wave filter according to claim 9, wherein an area between a pair of the adjacent electrode fingers provided in the neighboring IDT's is metallized.

13. A longitudinally coupled resonator type surface acoustic wave filter comprising plural longitudinally coupled resonator type surface acoustic wave filters of claim 9 plural-stage dependently connected.

14. A communication device comprising longitudinally coupled resonator type surface acoustic wave filters of claim 9.

15. A longitudinally coupled resonator type surface acoustic wave filter comprising:

a piezoelectric substrate; and first, second, and third IDT's provided on the piezoelectric substrate to extend along the surface acoustic wave propagation direction and having plural electrode fingers, respectively;

at least one of the first, second, and third IDT's including at least one narrow pitch electrode finger portion in which the pitches of a portion of the electrode fingers arranged from the end of the IDT on the neighboring IDT side are less than the remaining portion of the electrode fingers in the IDT; wherein $\lambda I2$ represents the wavelength determined by the electrode finger pitch of the narrow pitch electrode finger portion, and $\lambda I1$ represents the pitch of the electrode finger portion provided in the IDT containing the narrow pitch electrode finger portion and being other than the narrow pitch electrode finger portion;

the distance between the centers of the adjacent electrode fingers provided in the narrow pitch electrode finger portion and the electrode finger portion other than the narrow pitch electrode finger portion being deviated from $0.25 \lambda I1+0.25 \lambda I2$.

16. A longitudinally coupled resonator type surface acoustic wave filter comprising plural longitudinally coupled resonator type surface acoustic wave filters of claim 15 plural-stage dependently connected.

17. A communication device comprising longitudinally coupled resonator type surface acoustic wave filters of claim 15.

18. A longitudinally coupled resonator type surface acoustic wave filter according to claim 15, wherein the deviation amount of the distance between the centers of the adjacent electrode fingers is up to $0.25 \lambda I1$.

19. A longitudinally coupled resonator type surface acoustic wave filter according to claim 15, wherein the electrode covering ratio of one electrode finger of a pair of the adjacent electrode fingers provided in the neighboring IDT's is relatively high, whereby the gap between a pair of the adjacent electrode fingers is reduced.

20. A longitudinally coupled resonator type surface acoustic wave filter according to claim 15, wherein an area between a pair of the adjacent electrode fingers provided in the neighboring IDT's is metallized.

21. A longitudinally coupled resonator type surface acoustic wave filter comprising:

a piezoelectric substrate; and first, second, and third IDT's provided on the piezoelectric substrate so as to extend along the surface acoustic wave propagation direction and having plural electrode fingers, respectively;

at least one of the first, second, and third IDT's including at least one narrow pitch electrode finger portion in which the pitches of a portion of the electrode fingers arranged from the end of the IDT on the neighboring IDT side are shorter than the remaining portions of the electrode fingers, and an electrode finger portion succeeding the narrow pitch electrode finger portion has a relatively wide electrode finger pitch;

an electrode finger portion having a different electrode finger pitch being provided in the narrow pitch electrode finger portion.

22. A longitudinally coupled resonator type surface acoustic wave filter according to claim 21, wherein the distance between the centers of at least one pair of the adjacent electrode fingers provided in the narrow pitch electrode finger portions having different electrode finger pitches, respectively is deviated from $0.25 \lambda A+0.25 \lambda B$, in which $\lambda A$ and $\lambda B$ represent the wavelengths determined by the respective electrode finger pitches.

23. A longitudinally coupled resonator type surface acoustic wave filter according to claim 21, wherein the narrow pitch electrode finger portion is a chirp type electrode finger portion.

24. A longitudinally coupled resonator type surface acoustic wave filter according to claim 23, wherein the chirp type electrode finger portion is configured so as to have electrode finger pitches arranged in the linearly decreasing order from the center in the surface acoustic wave propagation direction of the IDT toward the outside thereof.

25. A longitudinally coupled resonator type surface acoustic wave filter comprising plural longitudinally coupled resonator type surface acoustic wave filters of claim 21 plural-stage dependently connected.

26. A communication device comprising longitudinally coupled resonator type surface acoustic wave filters of claim 21.

27. A longitudinally coupled resonator type surface acoustic wave filter comprising:

a piezoelectric substrate; and first, second, and third IDT's provided on the piezoelectric substrate to extend along the surface acoustic wave propagation direction and having plural electrode fingers, respectively;

at least one of the first, second, and third IDT's including at least one narrow pitch electrode finger portion in which the pitch of a portion of the electrode fingers arranged from the end of the IDT on the neighboring IDT side is shorter than that of the remaining portions of the electrode fingers in the IDT; wherein $\lambda I2$ represents the wavelength determined by the electrode finger pitch in the narrow pitch electrode finger portion, and $\lambda I1$ represents the pitch in the electrode finger portion provided in the IDT containing the narrow pitch electrode finger portion and being other than the narrow pitch electrode finger portion;

the distance between the centers of the adjacent electrode fingers provided in the neighboring IDT's, respectively, being set to be different from $0.5 \lambda I2$, when the narrow pitch electrode finger portions are provided adjacently to each other in both of the neighboring IDT's, and moreover, being deviated from $0.25 \lambda I1+0.25 \lambda I2$, when the narrow pitch electrode finger portion is provided in only one of the IDT's;

the distance between the centers of the adjacent electrode fingers provided in the narrow pitch electrode finger portion and the electrode finger portion other than the narrow pitch electrode finger portion being deviated from 0.25 λI1+0.25 λI2.

28. A longitudinally coupled resonator type surface acoustic wave filter according to claim 27, wherein an area between a pair of the adjacent electrode fingers provided in the neighboring IDT's is metallized.

29. A longitudinally coupled resonator type surface acoustic wave filter according to claim 27, wherein the deviation amount of the distance between the centers of the adjacent electrode fingers is up to 0.25 λI1.

30. A longitudinally coupled resonator type surface acoustic wave filter according to claim 27, wherein the electrode covering ratio of one electrode finger of a pair of the adjacent electrode fingers provided in the neighboring IDT's is relatively high, whereby the gap between a pair of the adjacent electrode fingers is reduced.

31. A longitudinally coupled resonator type surface acoustic wave filter comprising plural longitudinally coupled resonator type surface acoustic wave filters of claim 27 plural-stage dependently connected.

32. A communication device comprising longitudinally coupled resonator type surface acoustic wave filters of claim 27.

\* \* \* \* \*